United States Patent
Xiong et al.

(10) Patent No.: US 12,518,783 B2
(45) Date of Patent: *Jan. 6, 2026

(54) THIN-FILM PIEZOELECTRIC MATERIAL ELEMENT

(71) Applicant: SAE Magnetics (H.K.) Ltd., Hong Kong (CN)

(72) Inventors: Wei Xiong, Hong Kong (CN); Atsushi Iijima, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 937 days.

This patent is subject to a terminal disclaimer.

(21) Appl. No.: 17/679,195

(22) Filed: Feb. 24, 2022

(65) Prior Publication Data

US 2022/0180896 A1    Jun. 9, 2022

Related U.S. Application Data

(60) Continuation-in-part of application No. 16/289,686, filed on Mar. 1, 2019, now Pat. No. 11,295,770, (Continued)

(51) Int. Cl.
*H01L 41/053* (2006.01)
*C23C 14/02* (2006.01)
(Continued)

(52) U.S. Cl.
CPC .......... *G11B 5/4873* (2013.01); *C23C 14/025* (2013.01); *C23C 14/088* (2013.01);
(Continued)

(58) Field of Classification Search
CPC . H10N 30/877; H10N 30/8554; H10N 30/708
(Continued)

(56) References Cited

U.S. PATENT DOCUMENTS

| 6,709,776 B2 | 3/2004 | Noguchi et al. |
| 9,401,469 B2 | 7/2016 | Xiong et al. |

(Continued)

FOREIGN PATENT DOCUMENTS

| JP | 6-350154 | 12/1994 |
| JP | 2016-072589 | 5/2016 |
| JP | 2016-149748 | 8/2016 |

OTHER PUBLICATIONS

U.S. Appl. No. 16/289,686, filed Mar. 1, 2019, 2019/0279670, Thin-Film Piezoelectric Material Substrate, Thin-Film Piezoelectric Material Element, Head Gimbal Assembly, Ink Jet Head and Method of Manufacturing the Thin-Film Piezoelectric Material Element.

(Continued)

*Primary Examiner* — Derek J Rosenau
(74) *Attorney, Agent, or Firm* — Nixon & Vanderhye, P.C.

(57) ABSTRACT

A thin-film piezoelectric material elements are arranged on a thin-film piezoelectric material substrate. The thin-film piezoelectric material substrate includes an insulator on Si substrate including a substrate including silicon and an insulating layer on a surface of the substrate. The thin-film piezoelectric material element includes a thin-film laminated part on a top surface of the insulating layer. The thin-film laminated part includes a YZ seed layer including yttrium and zirconium, and formed on the top surface; a lower electrode film laminated on the YZ seed layer; a piezoelectric material film including lead zirconate titanate, shown by a formula Pb $(Zr_xTi_{(1-x)})$ $O_3$ $(0 \leq x \leq 1)$, and an upper electrode film laminated on the piezoelectric material film. The thin-film laminated part further includes an upper piezoelectric-material protective-film, laminated on the upper side of the upper electrode film.

9 Claims, 33 Drawing Sheets

Related U.S. Application Data which is a division of application No. 14/958,043, filed on Dec. 3, 2015, now Pat. No. 10,276,196.

(51) Int. Cl.

| | | |
|---|---|---|
| *C23C 14/08* | (2006.01) | |
| *C30B 23/02* | (2006.01) | |
| *C30B 29/32* | (2006.01) | |
| *G11B 5/48* | (2006.01) | |
| *H10N 30/00* | (2023.01) | |
| *H10N 30/06* | (2023.01) | |
| *H10N 30/076* | (2023.01) | |
| *H10N 30/079* | (2023.01) | |
| *H10N 30/853* | (2023.01) | |
| *H10N 30/87* | (2023.01) | |
| *B41J 2/14* | (2006.01) | |

(52) U.S. Cl.
CPC .............. *C30B 23/02* (2013.01); *C30B 29/32* (2013.01); *H10N 30/06* (2023.02); *H10N 30/076* (2023.02); *H10N 30/079* (2023.02); *H10N 30/708* (2024.05); *H10N 30/8554* (2023.02); *H10N 30/877* (2023.02); *B41J 2002/14266* (2013.01)

(58) Field of Classification Search
USPC .......................................................... 310/311
See application file for complete search history.

(56) References Cited

U.S. PATENT DOCUMENTS

| | | | |
|---|---|---|---|
| 10,276,196 | B2 | 4/2019 | Xiong et al. |
| 10,607,641 | B1 | 3/2020 | Xiong et al. |
| 10,614,842 | B1 | 4/2020 | Xiong et al. |
| 11,295,770 | B2 * | 4/2022 | Xiong ................. G11B 5/4873 |
| 2013/0093290 | A1 | 4/2013 | Fox et al. |
| 2017/0162779 | A1 | 6/2017 | Xiong et al. |
| 2019/0279670 | A1 | 9/2019 | Xiong et al. |
| 2020/0091400 | A1 | 3/2020 | Xiong et al. |
| 2020/0091401 | A1 | 3/2020 | Xiong et al. |

OTHER PUBLICATIONS

U.S. Appl. No. 14/958,043, filed Dec. 3, 2015, 2017/0162779, Thin-Film Piezoelectric Material Substrate, Thin-Film Piezoelectric Material Element, Head Gimbal Assembly, Ink Jet Head and Method of Manufacturing the Thin-Film Piezoelectric Material Element.
Yoshinori Kato; Fujifilm Group's Inkjet Printhead and Technology, Fujifilm Research & Development (No. 59-2014) pp. 27-31.

* cited by examiner

THIN-FILM PIEZOELECTRIC MATERIAL ELEMENT

CROSS-REFERENCE TO RELATED APPLICATIONS

This application is a continuation-in-part application of application Ser. No. 16/289,686, filed Mar. 1, 2019, which is a divisional application of application Ser. No. 14/958,043, filed Dec. 3, 2015 (now U.S. Pat. No. 10,276,196, issued Apr. 30, 2019), the entire contents of each of which are hereby incorporated herein by reference.

BACKGROUND

Field of the Invention

The present invention relates to a thin-film piezoelectric material element having a piezoelectric material film and an electrode film.

Related Background Art

Piezoelectric material has been widely used for functional electronic components such as an actuator for generating deformation by applying voltage or a sensor for generating voltage from the deformation of elements in a reverse way, etc. A thin-film piezoelectric material, processed into thin-film like shape, is widely used for electronic device called MEMS (Micro Electro Mechanical Systems).

A lead (Pb)-based dielectric material having large piezoelectric characteristics, especially, Lead Zirconate Titanate, general formula, Pb $(Zr_xTi_{(1-x)})$ $O_3$-based perovskite-type ferroelectric called as "PZT", has been widely used as conventional piezoelectric material.

Crystal structure of this piezoelectric material formed of PZT varies with the $PbTiO_3/PbZrO_3$ which is a ratio of Lead Titanate $PbTiO_3$/Lead Zirconate $PbZrO_3$. A morphotropic phase boundary (MPB) divides the ferroelectric phase region of PZT into two regions including a tetragonal phase region (FT) and a rhombohedra phase region (FR). As known, when the crystal structure is located at the morphotropic phase boundary (MPB), the free energy of the spontaneous polarization is quite high, thus PZT has the best electromechanical conversion property and the best piezoelectric property.

Further, PZT in the rhombohedra phase region has a large piezoelectric property when poling is along the c axis direction. Therefore, it is effective that crystal structure of the thin-film piezoelectric material made of PZT (referred to also as "PZT thin-film") is oriented in a (001) direction.

When the thin-film piezoelectric material is applied to the MEMS, it is preferable that thin-film piezoelectric material layer made of high quality ferroelectric material (for example, PZT) is formed on a substrate having an insulating layer formed on its surface(referred to also as "insulator on Si substrate"). In this case, if oxide layer ($SiO_2$) of the insulator on Si substrate is formed in a thin-film shape, the oxide layer can serve as a layer having some function, and also can serve as a stopping layer for Reactive Ion Etching. Therefore, it is ideal for MEMS to have thin-film piezoelectric material formed on the insulator on Si substrate, from point of views of the cost, manufacturing process and performance.

On the other hand, epitaxial growth is one of the most important method to control the crystal orientation of the PZT along the (001) direction. As conventional technology concerning formation of PZT thin-film on a Si single crystal substrate, for example, there is a technology disclosed in the U.S. Pat. No. 6,709,776 (referred also to as Patent Document 1). It is disclosed in the Patent Document 1 that buffer layer, metal thin-film, conductive oxide thin-film are formed sequentially on the Si single crystal substrate by epitaxial growth, and the PZT thin-film is formed on the oxide thin-film by epitaxial growth.

Further, it is disclosed in U.S. Patent Application Publication No. 2013/0093290 (referred also to as Patent Document 2) that seed layer made of Ti or Ti $O_2$ are formed on the insulating substrate, and PZT thin-film is deposited on the seed layer of epitaxial growth by the same step with the seed layer. It is disclosed in JP Patent Application Publication No. H6-350154 (referred also to as Patent Document 3) that a Ti layer is formed on the insulating substrate with sputtering and PZT thin-film is formed on the Ti layer with sputtering. The PZT thin-film is formed with (111) orientation.

It is conventionally known that PZT thin-film formed with sputtering has high heat-resistant therefore being able to improve flexibility in high-temperature processing (for example, Fujifilm research & development (No. 59-2014), referred also to as Non Patent Document 1).

SUMMARY OF THE INVENTION

Concerning a application of the PZT thin-film to the MEMS, PZT thin-film having all of the following A), B), C) is strongly required. This is originated in that the PZT thin-film formed with the sputtering has high heat-resistant, and this is effective for MEMS.
A) PZT thin-film is formed on the insulator on Si substrate.
B) PZT thin-film is formed with epitaxial growth to be oriented along the (001) direction.
C) PZT thin-film is formed with sputtering.

However, PZT thin-film having all of the above-described A), B), C) is not able to be formed by conventional technology. Accordingly, the present inventors have strongly examined about the structure of PZT thin-film having all of the above-described A), B), C), and manufacturing method of the same, and have completed the present invention as that result.

The present invention is made to solve the above problem, and it has an object to provide the thin-film piezoelectric material element having all of the above-described A), B), C), especially being effective to MEMS.

To solve the above problem, the present invention is a thin-film piezoelectric material element arranged on a thin-film piezoelectric material substrate, the thin-film piezoelectric material substrate includes: an insulator on Si substrate including a substrate including silicon and an insulating layer on a surface of the substrate; the thin-film piezoelectric material element includes a thin-film laminated part on a top surface of the insulating layer, the thin-film laminated part includes: a YZ seed layer including yttrium and zirconium, and formed on the top surface of the insulating layer of the insulator on Si substrate; a lower electrode film laminated on the YZ seed layer; a piezoelectric material film including lead zirconate titanate, shown by a formula Pb $(Zr_xTi_{(1-x)})$ $O_3$ (0≤x≤1), and laminated on the lower electrode film; and an upper electrode film laminated on the piezoelectric material film, the piezoelectric material film is an epitaxial film, the piezoelectric material film has diffraction intensity peaks of a (001) plane and a (002) plane, the lower electrode film includes Pt and has a diffraction intensity peak of a Pt (200) plane and the YZ seed layer has a diffraction intensity peak of a (400) plane, the thin-film laminated part further includes an upper piezoelectric-material protective-film, laminated on the upper side of the upper electrode film.

In case of the above-described thin-film piezoelectric material element, it is preferable that the thin-film laminated part further includes a lower piezoelectric-material protective-film, laminated between the YZ seed layer and the lower electrode film.

Further, it is preferable that the thin-film laminated part further includes a contact via hole which reach the surface of the lower electrode film through the piezoelectric material film.

Furthermore, it is preferable that the YZ seed layer has a two layer structure including a yttrium layer comprising yttrium and a zirconium layer comprising zirconium or one layer structure comprising a zirconium compound including yttrium and zirconium, the YZ seed layer has a thickness of 10 nm to 50 nm.

Further, the present invention provides a thin-film piezoelectric material element arranged on a thin-film piezoelectric material substrate, the thin-film piezoelectric material substrate includes: an insulator on Si substrate including a substrate including silicon and an insulating layer on a surface of the substrate; the thin-film piezoelectric material element comprises a thin-film laminated part on a top surface of the insulating layer, the thin-film laminated part includes: a YZ seed layer including yttrium and zirconium, and formed on the top surface of the insulating layer of the insulator on Si substrate; a lower electrode film laminated on the YZ seed layer; a piezoelectric material film including lead zirconate titanate, shown by a formula Pb $(Zr_xTi_{(1-x)})O_3 (0 \leq x \leq 1)$, and laminated on the lower electrode film; and an upper electrode film laminated on the piezoelectric material film, the piezoelectric material film is an epitaxial film, the piezoelectric material film has diffraction intensity peaks of a (001) plane and a (002) plane, the lower electrode film includes Pt and has a diffraction intensity peak of a Pt (200) plane and the YZ seed layer has a diffraction intensity peak of a (400) plane, the thin-film laminated part further includes a stress balancing film, laminated on the upper side of the upper electrode film.

Further, the present invention provides a thin-film piezoelectric material element arranged on a thin-film piezoelectric material substrate, the thin-film piezoelectric material substrate includes: an insulator on Si substrate including a substrate including silicon and an insulating layer on a surface of the substrate; the thin-film piezoelectric material element includes a thin-film laminated part on a top surface of the insulating layer, the thin-film laminated part includes: a YZ seed layer including yttrium and zirconium, and formed on the top surface of the insulating layer of the insulator on Si substrate; a lower electrode film laminated on the YZ seed layer; a piezoelectric material films layer, laminated on the lower electrode film; and an upper electrode film laminated on the piezoelectric material films layer, the piezoelectric material films layer includes a first piezoelectric material film and a second piezoelectric material film; the first piezoelectric material film and the second piezoelectric material film respectively include lead zirconate titanate, shown by a formula Pb $(Zr_xTi_{(1-x)})O_3 (0 \leq x \leq 1)$, and are epitaxial films, the first piezoelectric material film and second piezoelectric material film respectively have diffraction intensity peaks of a (001) plane and a (002) plane, the lower electrode film includes Pt and has a diffraction intensity peak of a Pt (200) plane and the YZ seed layer has a diffraction intensity peak of a (400) plane.

In case of the above-described thin-film piezoelectric material element, it is preferable that the thin-film laminated part further includes a stress balancing film laminated on the upper side of the upper electrode film.

In case of the above-described thin-film piezoelectric material element, it is preferable that the piezoelectric material films layer includes a laminated structure which the second piezoelectric material film is laminated on the first piezoelectric material film, the first piezoelectric material film has a size larger than a size of the second piezoelectric material film, the first piezoelectric material film and the second piezoelectric material film respectively include a first outer end part and a second outer end part, the first outer end part and the second outer end part are respectively arranged in the outside of the first piezoelectric material film and the second piezoelectric material film along a surface direction of the respective first piezoelectric material film and second piezoelectric material film, the first piezoelectric material film and the second piezoelectric material film respectively include sizes which a distance between the first outer end part and the second outer end part is equal to or smaller than three times of a thickness of the first piezoelectric material film.

Further, the piezoelectric material films layer includes a laminated structure which the second piezoelectric material film is laminated on the first piezoelectric material film, the first piezoelectric material film has a size larger than a size of the second piezoelectric material film, and the second piezoelectric material film has a size larger than the stress balancing film, the first piezoelectric material film and the second piezoelectric material film respectively include a first outer end part and a second outer end part, the first outer end part and the second outer end part are respectively arranged in the outside of the first piezoelectric material film and the second piezoelectric material film along a surface direction of the respective first piezoelectric material film and second piezoelectric material film, the first piezoelectric material film and the second piezoelectric material film respectively include sizes which a distance between the first outer end part and the second outer end part is equal to or smaller than three times of a thickness of the first piezoelectric material film.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

First Embodiment

In the following, first embodiment of the present invention will be described with reference to the drawings. Note that the same components will be referred to with the same numerals or letters, while omitting their overlapping descriptions.

Structure of Thin-Film Piezoelectric Material Substrate

To begin with, structure of the thin-film piezoelectric material substrate 1 according to the first embodiment of the present invention will be explained with reference to FIG. 1 to FIG. 4.

Here, FIG. 1(a) is a perspective view showing whole of the thin-film piezoelectric material substrate 1 according to the first embodiment of the present invention, FIG. 1(b) is a plan view showing the surface of the thin-film piezoelectric material substrate 1 after element sections 10 are formed.

Figure 1:
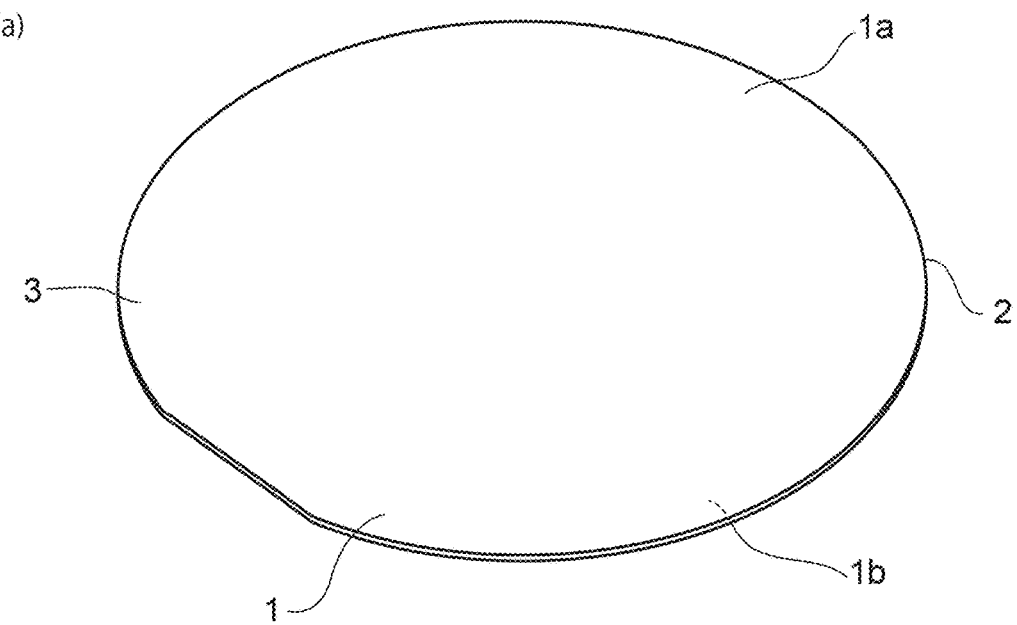
FIG. 1(a) is a perspective view showing whole of the thin-film piezoelectric material substrate.
FIG. 1(b) is a plan view showing the surface of the thin-film piezoelectric material substrate after forming of element sections.
Figure 1:
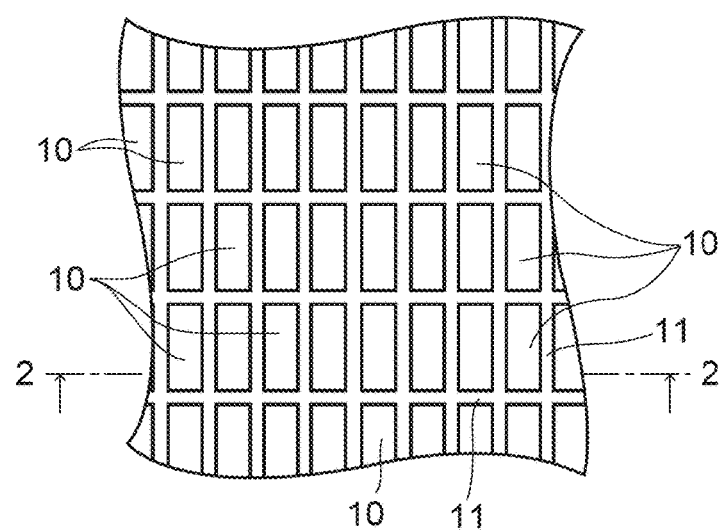
Figure 2:
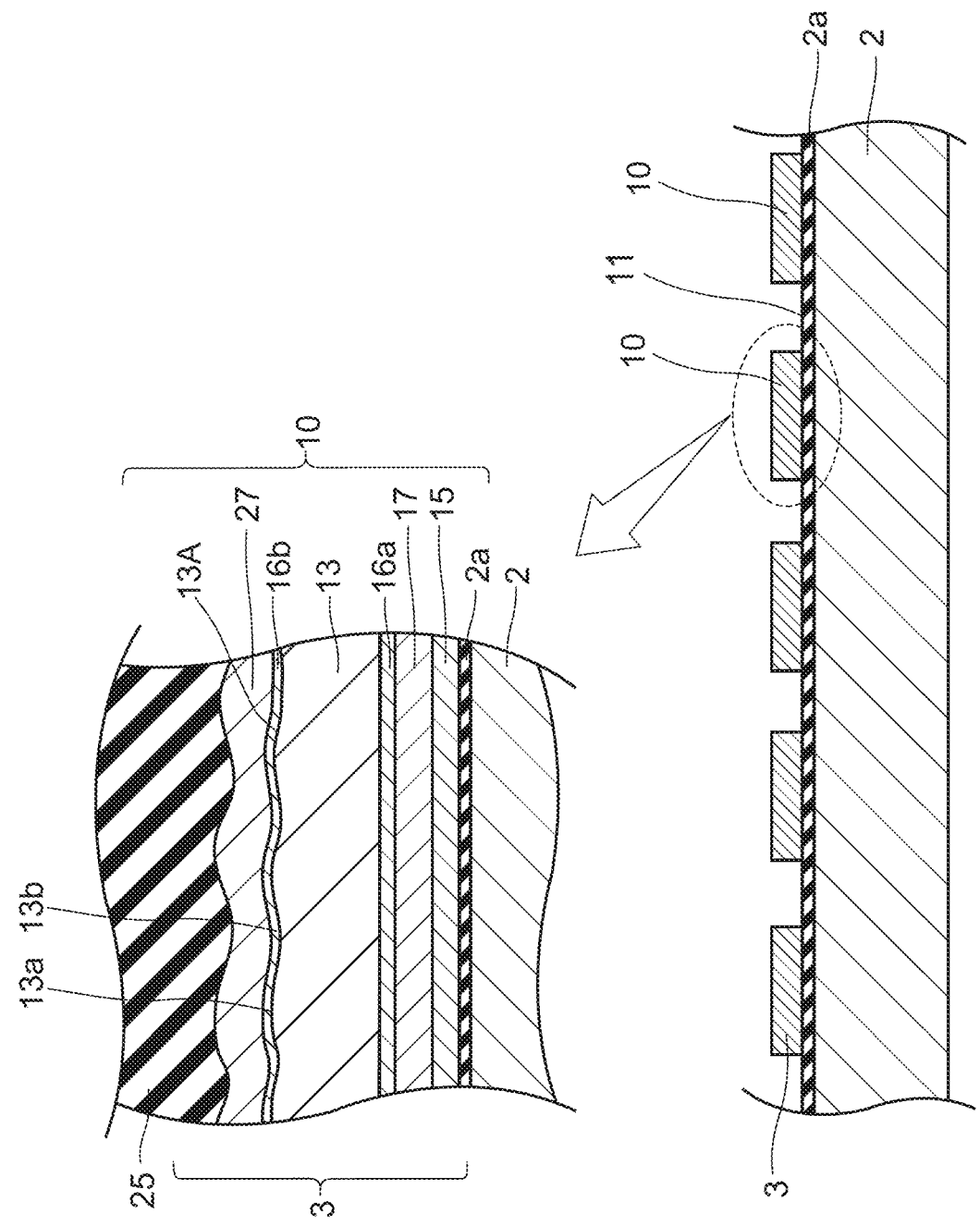
FIG. 2 is a sectional view taken along the line 2-2 in FIG. 1(b)
Figure 3:
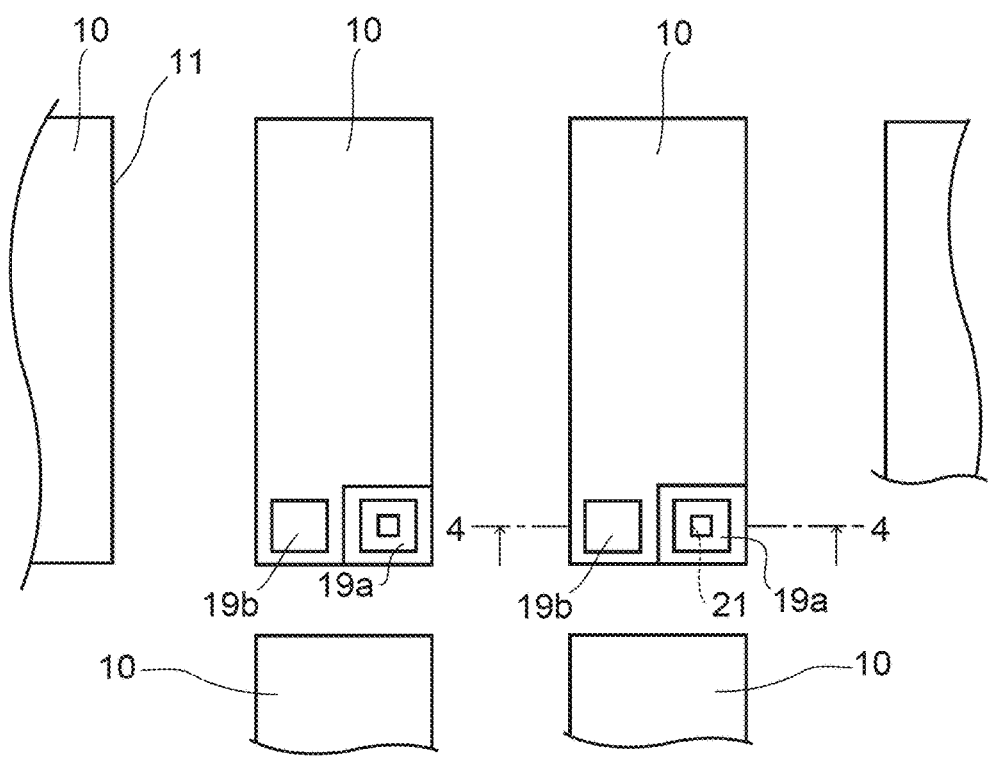
FIG. 3 is a plan view, with enlargement, showing a principal part of a first surface after forming of element sections.
Figure 4:
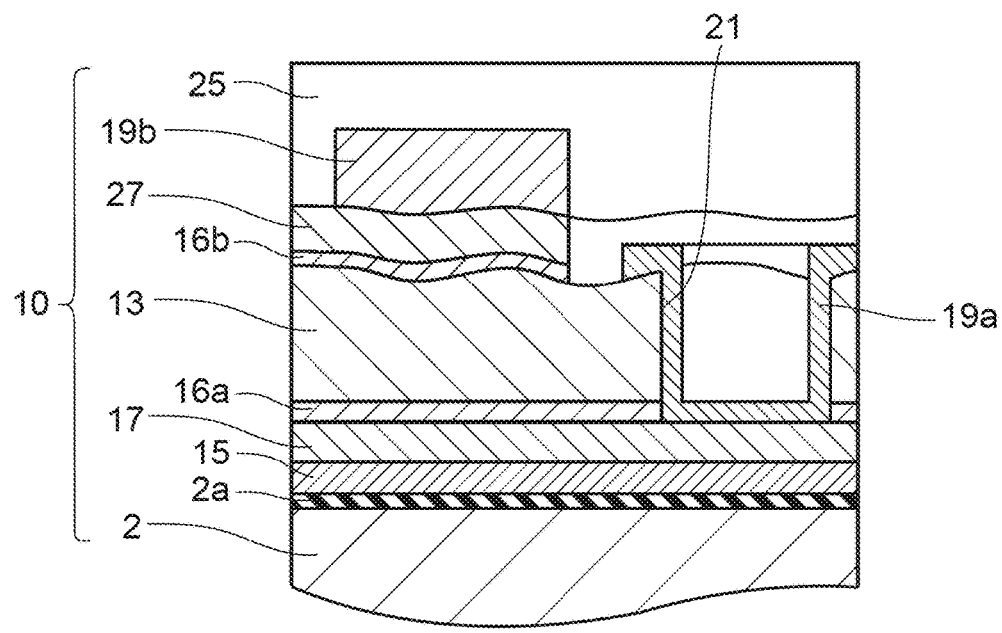
FIG. 4 is a sectional view taken along the line 4-4 in FIG. 3.

FIG. 2 is a sectional view taken along the line 2-2 in FIG. 1(b), FIG. 3 is a plan view showing a principal part of a first surface 1a after element sections 10 are formed, FIG. 4 is a sectional view taken along the line 4-4 in FIG. 3.

The thin-film piezoelectric material substrate 1 has an insulator on Si substrate 2 and a thin-film laminated part 3.

As illustrated in FIG. 2, the insulator on Si substrate 2 has a silicon wafer as a substrate for deposition and an insulating layer 2a, made of $SiO_2$, formed on the surface of the silicon wafer.

As illustrated in FIG. 1(a), the thin-film laminated part 3 is formed on the first surface 1a of the thin-film piezoelectric material substrate 1. The rear side of the first surface 1a is a second surface 1b.

The thin-film piezoelectric material substrate 1 according to the first embodiment of the present invention includes a substrate, which a plurality of later-described element sections 10 are not formed (FIG. 1(a)), and a substrate, which a plurality of element sections 10 are formed (FIG. 1(b)).

The thin-film laminated part 3 is formed on the top surface of the insulating layer 2a. As illustrated in FIG. 2, the thin-film laminated part 3 has a laminated structure which a plurality of thin-films, including the later-described YZ seed layer 15, a lower electrode film 17, a lower diffusion barrier film 16a, a piezoelectric material film 13, an upper diffusion barrier film 16b and an upper electrode film 27, are laminated.

As illustrated in FIG. 1(b), a plurality of element sections 10 are able to be formed in the thin-film laminated part 3. Element sections 10 are separated by gap parts 11, and they are arranged regularly in longitudinal direction and horizontal direction. The later-described thin-film piezoelectric element 12b is formed with each element section 10.

Each element section 10 is formed approximately rectangular shape in a plan view, as illustrated in FIG. 3. A lower terminal electrode 19a, an upper terminal electrode 19b and a contact via hole 21 are formed one side of long-side direction of each element section 10.

As illustrated in FIG. 4, the contact via hole 21 is the via hole section which reach the surface of the lower electrode film 17 through the upper diffusion barrier film 16b, the piezoelectric material film 13 and the lower diffusion barrier film 16a. A lower terminal electrode 19a is formed inside the contact via hole 21. The bottom section of the lower terminal electrode 19a is directly connected with the surface of the lower electrode film 17. The upper terminal electrode 19b is directly connected with the surface of the upper electrode film 27.

It is possible that an insulating film made of polyimide or the like is formed on the upper terminal electrode 19b so as to cover the element sections 10, not illustrated. In that case, a through hole is formed in the insulating film to secure electrical connection with each lower terminal electrode 19a and upper terminal electrode 19b.

Structure of Thin-Film Piezoelectric Material Element

Subsequently, structure of the thin-film piezoelectric material element 12b will be explained with reference to FIG. 5 in addition to FIG. 2.

Figure 5:
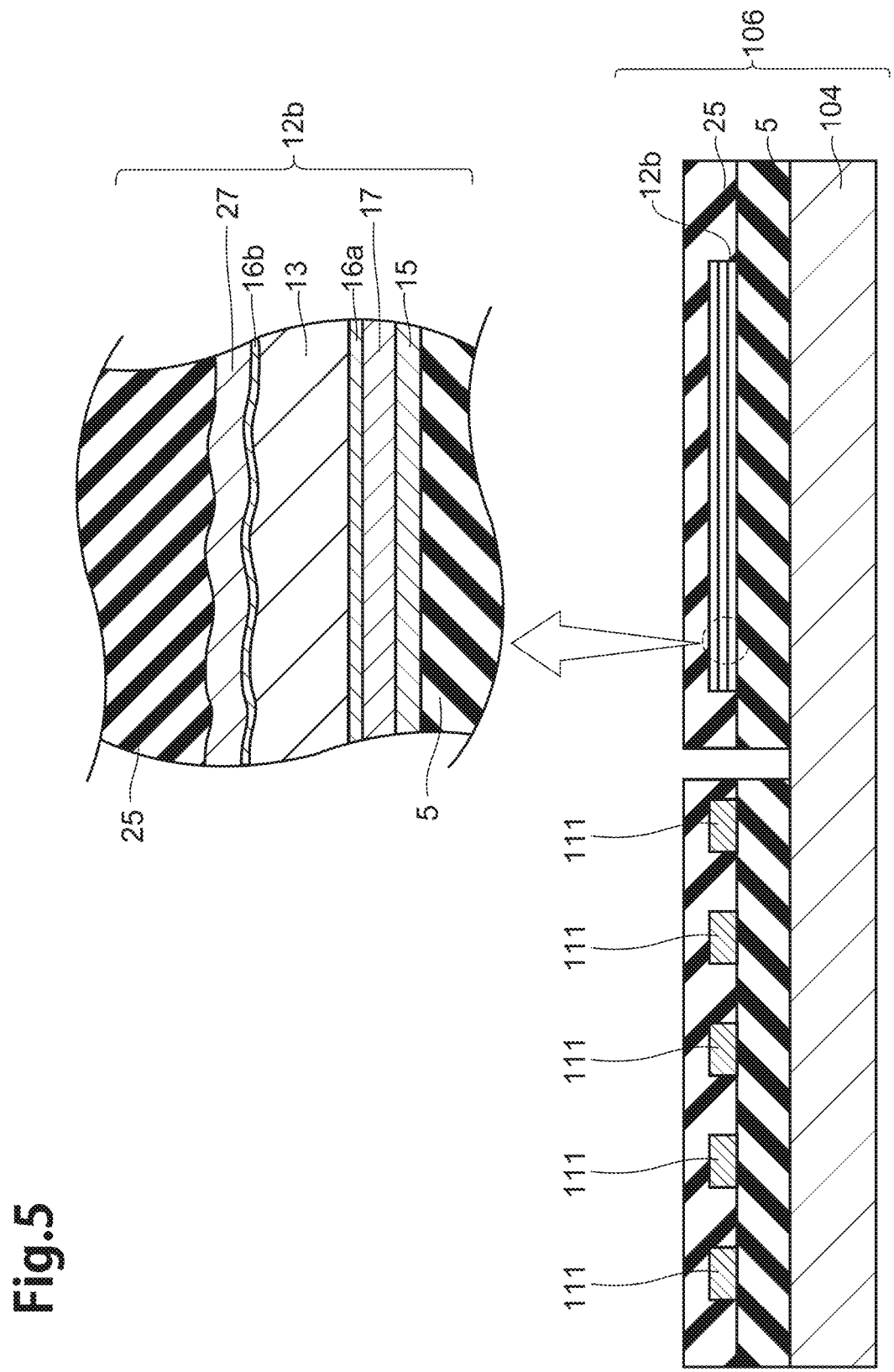
FIG. 5 is a sectional view taken along the line 5-5 in FIG. 18.
Figure 18:
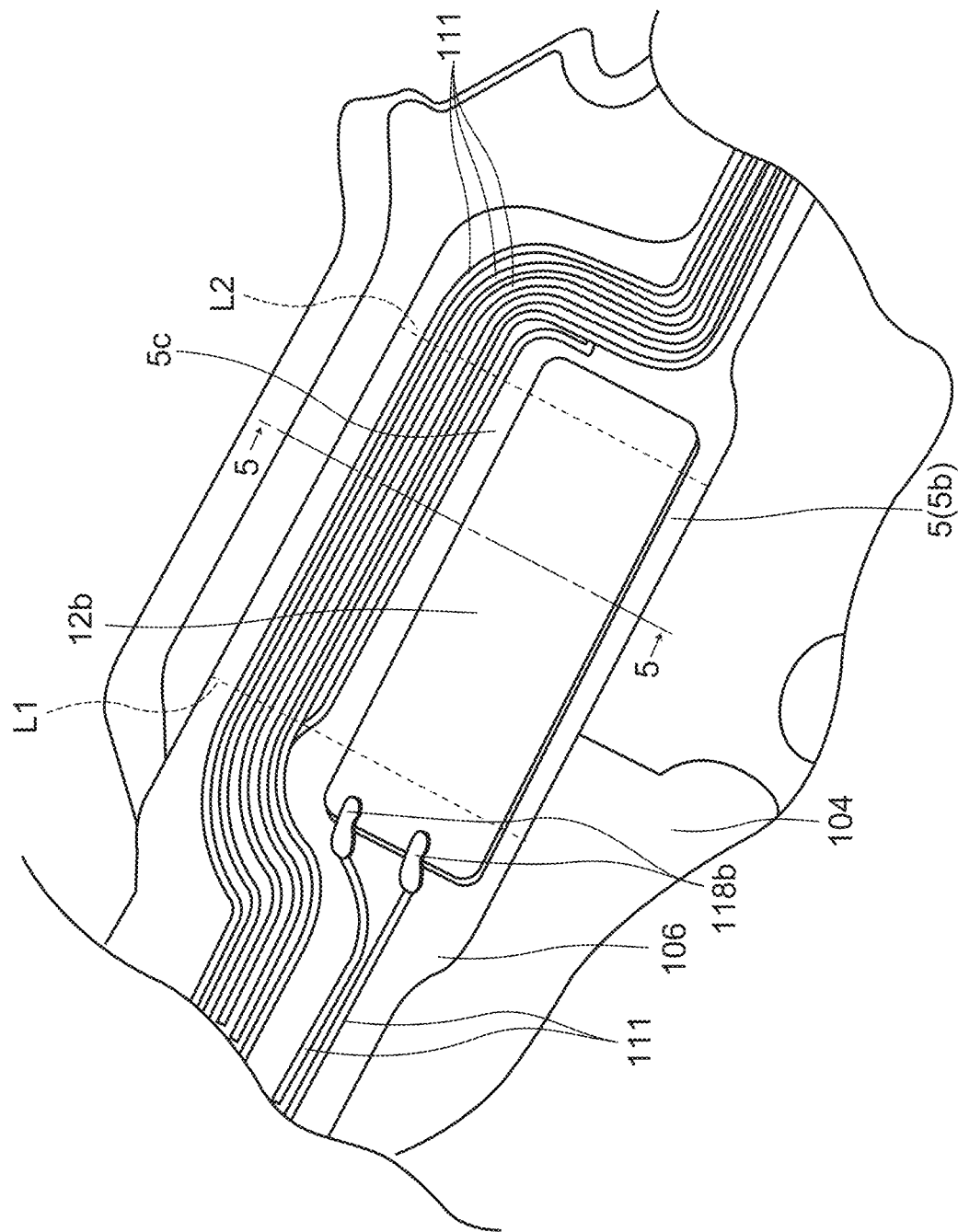
FIG. 18 is a perspective view, with enlargement, showing a part, of a flexure, which a thin-film piezoelectric material element is fixed.

Here, FIG. 5 is a sectional view taken along the line 5-5 in FIG. 18 showing an enlarged part, of later-described flexure 106, which the thin-film piezoelectric material element 12b is adhered.

The thin-film piezoelectric material element 12b (similar to the thin-film piezoelectric material element 12a) is adhered to the flexure 106 of the HGA 101. The thin-film piezoelectric material element 12b is manufactured with the above-described the thin-film piezoelectric material substrate 1 (thin-film piezoelectric material substrate 1 having the plurality of element sections 10). The thin-film piezoelectric material element 12b is formed with each element section 10 after the insulator on Si substrate 2 is removed from the thin-film piezoelectric material substrate 1.

The thin-film piezoelectric material element 12b is adhered to the surface of the later-described base insulating layer 5 using not illustrated epoxy resin.

As illustrated in FIG. 2 and FIG. 5, the thin-film piezoelectric material element 12b (similar to the thin-film piezoelectric material element 12a) has the YZ seed layer 15, the lower electrode film 17, the lower diffusion barrier film 16a, the piezoelectric material film 13, the upper diffusion barrier film 16b and the upper electrode film 27. The lower electrode film 17 is laminated on the YZ seed layer 15, the lower diffusion barrier film 16a is laminated on the lower electrode film 17. The piezoelectric material film 13 is laminated on the lower diffusion barrier film 16a. The upper diffusion barrier film 16b is laminated on the piezoelectric material film 13. The upper electrode film 27 is laminated on the upper diffusion barrier film 16b.

Note that "upper" and "lower" in the present invention do not show necessarily upper side, lower side in a condition which the thin-film piezoelectric material element is adhered on the base insulating layer 5. These words are terms for reasons of convenience so as to distinguish two upper, lower electrode films and so on opposing each other sandwiching the piezoelectric material film 13 their between. In the actual products, the upper electrode film 27 and upper diffusion barrier film 16b are sometimes disposed lower side, and the lower electrode film 17 and lower diffusion barrier film 16a are sometimes disposed upper side.

The YZ seed layer 15 has two layers structure which an yttrium layer made of yttrium and a zirconium layer made of zirconium are laminated. For example, the yttrium layer is able to be formed with yttrium oxide ($Y_2O_3$), and the zirconium layer is able to be formed with zirconium oxide ($ZrO_2$).

Further, it is possible that the YZ seed layer 15 has one layer structure with zirconium compound ($YZrO_x$) including yttrium and zirconium.

The YZ seed layer 15 has about 10 nm-50 nm film thickness, for example, and it is formed by high temperature evaporation on 900° C. or exceeds 900° C. (this will be explained in detail later). The high temperature evaporation on 900° C. or exceeds 900° C. establishes an orientation of crystal structure constituting the YZ seed layer 15. The YZ seed layer 15 is oriented along the (400) plane direction. As described in detail later, XRD shows the existence of only diffraction intensity peak for YZ(400) plane direction, about the YZ seed layer 15.

The piezoelectric material film 13 is formed to be a thin-film shape using a piezoelectric material made of lead zirconate titanate, shown by general formula Pb ($Zr_xTi_{(1-x)}$)$O_3$ (referred to also as "PZT" in the following). The piezoelectric material film 13 is an epitaxial film formed by epitaxial growth, and for example it has a thickness of about 1 μm-5 μm. Further, the piezoelectric material film 13 is sputter film formed by sputtering.

Figure 9:
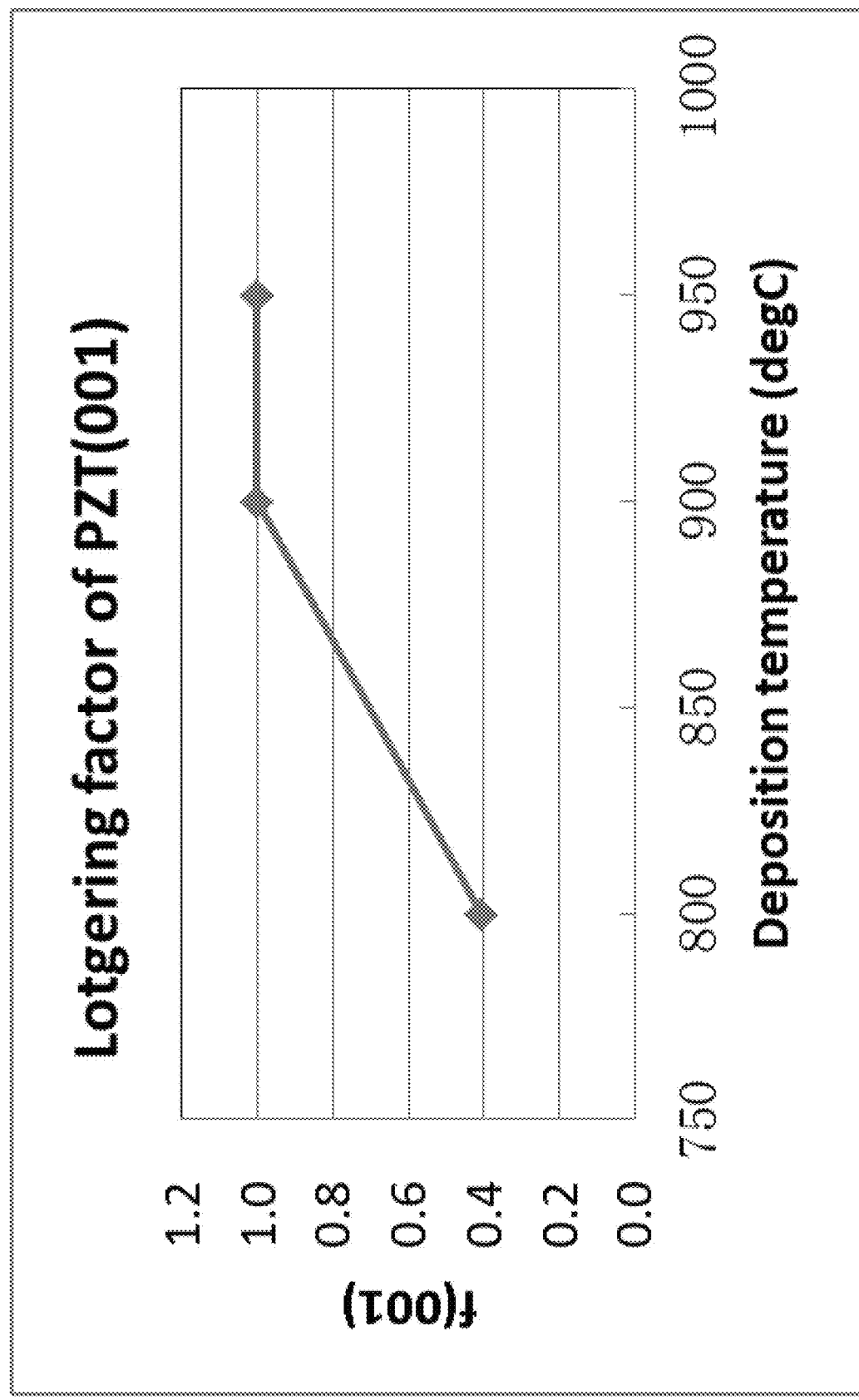
FIG. 9 is a graph showing orientation degree of diffraction intensity peak of PZT (001) plane with YZ seed layer deposition temperature of 800, 900, 900° C. respectively.

The piezoelectric material film 13 according to the first embodiment of the present invention is orientated along the (001) plane direction or (002) plane direction. Orientation degree of the piezoelectric material film 13 along the (001), (002) plane direction is about 100%, as shown in FIG. 9

Further, in this embodiment, a surface of the upper electrode film 27 side of the piezoelectric material film 13 (referred to also as upper surface) is a concavity and convexity surface 13A. The concavity and convexity surface 13A has a plurality of bending convex parts 13a and bending concave parts 13b. In the concavity and convexity surface 13A, each convex part 13a and concave part 13b are arranged one after the other along the concavity and convexity surface 13A, and its sectional form is a wave form. Each convex part 13a and concave part 13b are curved surfaces which slant gently. In this embodiment, an outside part, convexly projected from a center surface along the height direction of the concavity and convexity surface 13A, is the convex part 13a, an inside part, concavely hollowed from the center surface and connected to the convex part 13a, is the concave part 13b.

Note that the illustrated piezoelectric material film 13 has the concavity and convexity surface 13A, as preferable embodiment, the piezoelectric material film 13 is able to have a structure not having the concavity and convexity surface 13A.

Further, the upper diffusion barrier film 16b has the concavity and convexity structure in accordance with the concavity and convexity surface 13A, the upper surface of the upper diffusion barrier film 16b becomes the concavity and convexity surface in accordance with the concavity and convexity surface 13A. In this case, the upper surface of the upper diffusion barrier film 16b has a concavity and convexity in accordance with the concavity and convexity surface 13A.

The lower electrode film 17 is a thin-film (thickness about 10 nm-35 nm) made of metal element which has Pt (200) as main ingredient for example, it is formed on the YZ seed layer 15. The lower electrode film 17 is formed by sputtering. As described in detail later, XRD shows the existence of only diffraction intensity peak for Pt(200) plane direction, about the lower electrode film 17.

The lower diffusion barrier film 16a is a thin-film (thickness about 20 nm) made of conductive material, including strontium and ruthenium, such as $SrRuO_3$ or the like formed by epitaxial growth. The lower diffusion barrier film 16a is formed by sputtering. The lower diffusion barrier film 16a is formed on the upper surface of the lower electrode film 17 of the piezoelectric material film 13 side. The piezoelectric material film 13 is formed on the lower diffusion barrier film 16a.

The upper diffusion barrier film 16b is a thin-film (thickness about 10 nm-35 nm) made of amorphous conductive material, including strontium and ruthenium, such as $SrRuO_3$ or the like, and it is formed on the concavity and convexity surface 13A of the piezoelectric material film 13. The upper diffusion barrier film 16b is also formed by sputtering. As described above, the upper surface of the upper diffusion barrier film 16b becomes a concavity and convexity surface according to the concavity and convexity surface 13A.

The upper electrode film 27 is a polycrystal thin-film (thickness about 10 nm-35 nm) with metal element which has Pt as main ingredient, it is formed on the upper diffusion barrier film 16b. As described above, the upper surface of the upper electrode film 27 is a concavity and convexity surface according to the concavity and convexity surface 13A. The upper electrode film 27 is also formed by sputtering.

In the thin-film piezoelectric material element 12b, the above-described upper terminal electrode 19b and lower terminal electrode 19a are directly connected with the surfaces of the upper electrode film 27 and lower electrode film 17 the respectively. The upper terminal electrode 19b and lower terminal electrode 19a are connected to later-described connecting wiring 111 through the later-described electrode pad 118b.

The protective insulating layer 25 is formed so as to cover the whole surface of the thin-film piezoelectric material element 12b. The protective insulating layer 25 is formed with polyimide for example, and it has a thickness of about 1 μm to 10 μm. The thin-film piezoelectric material elements 12b do not need to be covered with the protective insulating layer 25, when thin-film piezoelectric material elements 12b have a protective insulating layer.

It is preferable that crystalline of the upper electrode film 27 is different from crystalline of the lower electrode film 17. It is preferable that the lower electrode film 17 is a conductive thin-film formed by epitaxial growth, and it is possible that the conductive thin-film not formed by epitaxial growth is used as the upper electrode film 27. It is more preferable that Pt thin-film formed by epitaxial growth is used as the lower electrode film 17, polycrystal conductive thin-film is used as the upper electrode film 27.

Method of Manufacturing the Thin-Film Piezoelectric Material Substrate and Thin-Film Piezoelectric Material Element Subsequently, the method of manufacturing the thin-film piezoelectric material substrate 1 and thin-film piezoelectric material element 12b will be explained with reference to FIG. 10-FIG. 14. The thin-film piezoelectric material substrate 1 and thin-film piezoelectric material element 12b (similar to the thin-film piezoelectric material element 12a) are manufactured as following.

To begin with, a substrate manufacturing step is performed to manufacture the thin-film piezoelectric material substrate 1. In the substrate manufacturing step, a silicon wafer is prepared, and thermal oxidation is performed for the silicon wafer, thereby the insulating layer 2a is formed on one side of the silicon wafer. Then, the insulator on Si substrate 2 is obtained.

After that, the thin-film laminated part 3 is formed on the top surface of the insulating layer 2a, thereby the thin-film piezoelectric material substrate 1 is manufactured.

A thin-film laminated part forming step for forming the thin-film laminated part 3 is included in the substrate manufacturing step. Later-described YZ seed layer forming step and piezoelectric material film forming step are included in the thin-film laminated part forming step.

Figure 10:
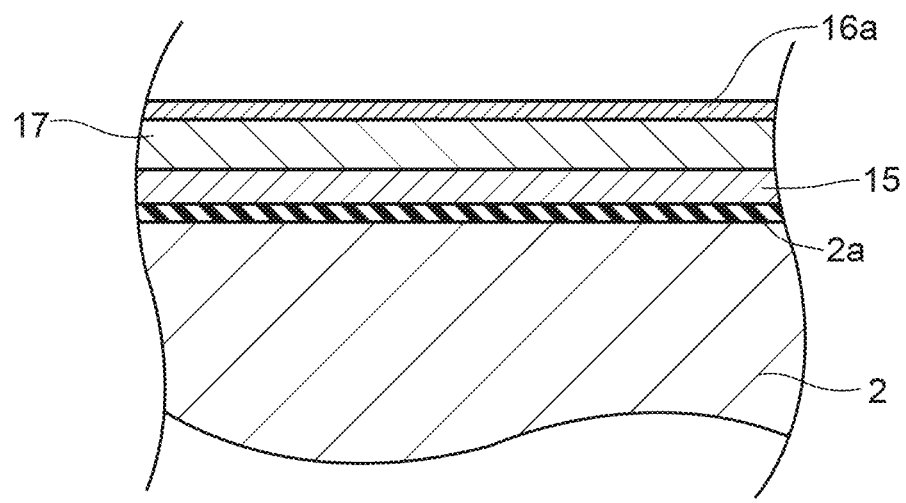
FIG. 10 is a sectional view showing a manufacturing step of thin-film piezoelectric material element according to the first embodiment of the present invention.

When the thin-film laminated part forming step starts, to begin with, the YZ seed layer forming step is performed. In the YZ seed layer forming step, as illustrated in FIG. 10, the YZ seed layer 15 is formed on the top surface of the insulating layer 2a by vacuum evaporation.

In this case, a later-described YZ seed material heated 900° C. or exceeds 900° C. is used. The YZ seed material is vaporized in a vacuum chamber, and thereby the YZ seed layer 15 is formed on the top surface of the insulating layer 2a.

The YZ seed material is able to be formed with a first seed material including zirconium and second seed material including yttrium. First, second seed materials are used to form the YZ seed layer 15 having two layers structure which the zirconium layer and the yttrium layer are laminated. Further, the seed material made of yttrium zirconium compound including yttrium and zirconium are used to form the YZ seed layer 15 having one layer structure.

Subsequently, a lower electrode film forming step is performed. In this step, epitaxial growth of metal element which has Pt as a main ingredient is performed on the YZ seed layer 15 by sputtering. This epitaxial growth makes the lower electrode film 17.

Next, a lower diffusion barrier film forming step is performed. In this step, the lower diffusion barrier film 16a is formed with SRO for example, on upper surface of the lower electrode film 17 by sputtering.

Figure 11:
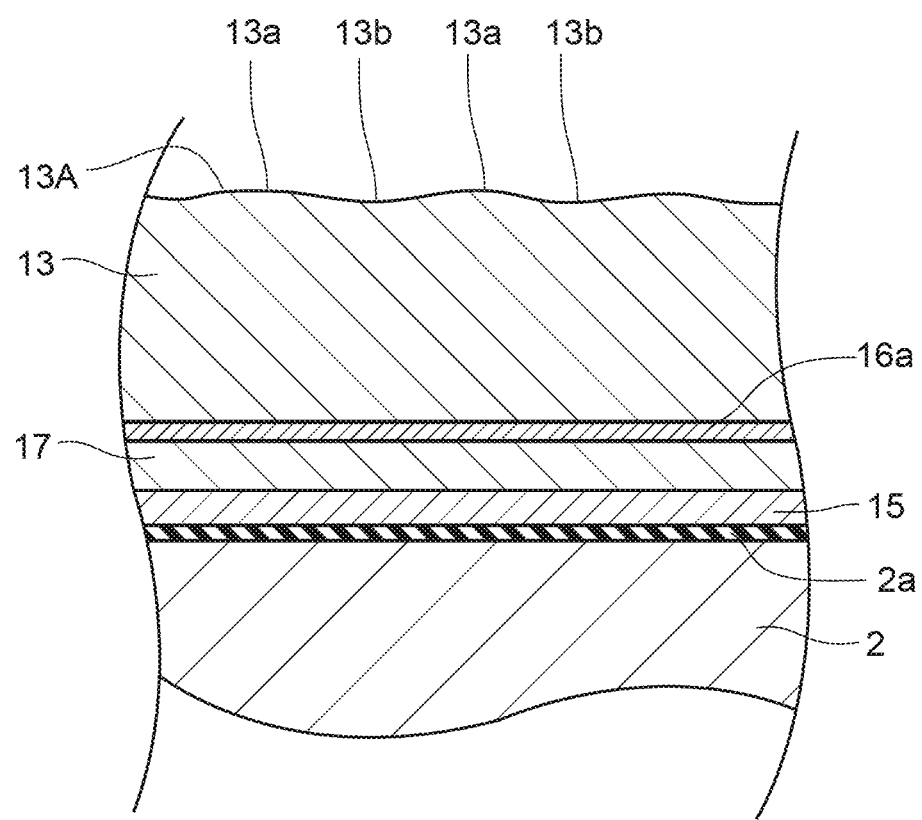
FIG. 11 is a sectional view showing a manufacturing step subsequent to that in FIG. 10.

After that, a piezoelectric material film forming step is performed. In this step, as illustrated in FIG. 11, epitaxial growth of thin-film made of PZT is performed on the lower diffusion barrier film 16a by sputtering to form the piezoelectric material film 13.

Figure 12:
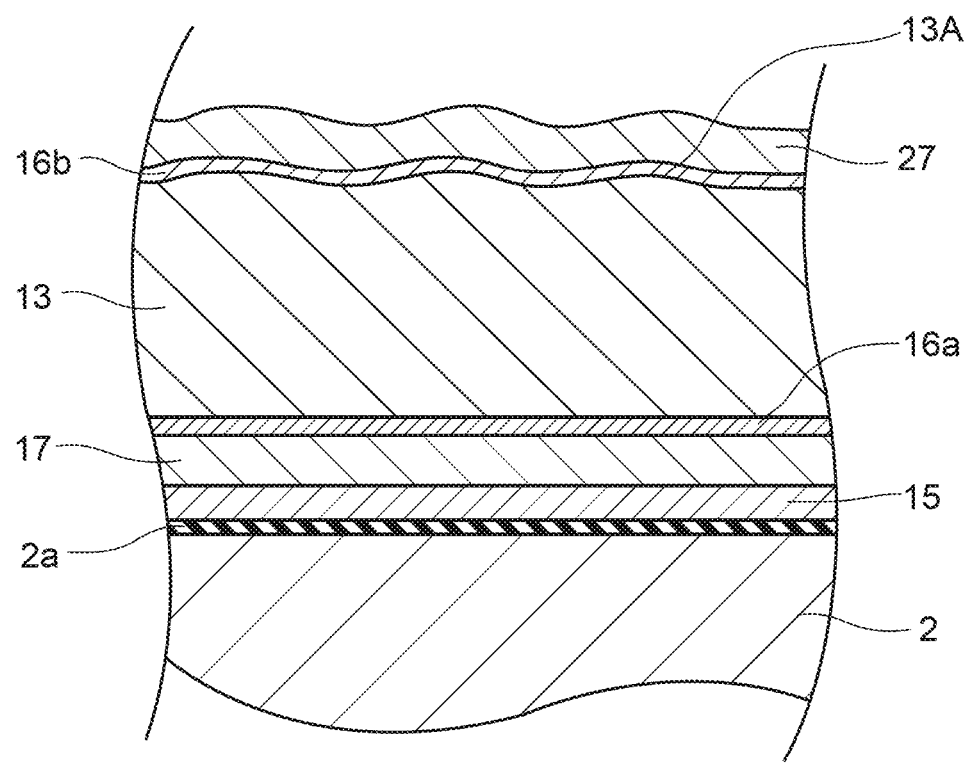
FIG. 12 is a sectional view showing a manufacturing step subsequent to that in FIG. 11.

Subsequently, an upper diffusion barrier film forming step is performed. In this step, the upper diffusion barrier film 16b is formed with SRO for example, on the concavity and convexity surface 13A of the piezoelectric material film 13 by sputtering, as illustrated in FIG. 12.

Further, the upper electrode film forming step is performed. In this step, growth of metal material having Pt as main ingredient is performed on the upper diffusion barrier film 16b by sputtering to form the upper electrode film 27.

The upper electrode film is able to be no-oriented polycrystal film or a preferentially oriented film with the (110) plane, or (111) plane, not epitaxial growth film.

As described above, the lower diffusion barrier film forming step and the upper diffusion barrier film forming step are performed, thereby the piezoelectric material film 13 and the upper electrode film 27 are formed respectively on the lower electrode film 17, the piezoelectric material film 13 via the lower diffusion barrier film 16a, the upper diffusion barrier film 16b respectively.

Figure 13:
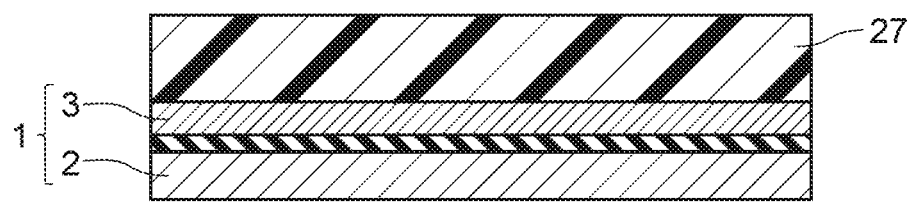
FIG. 13 is a sectional view showing a manufacturing step subsequent to that in FIG. 12.
Figure 14:
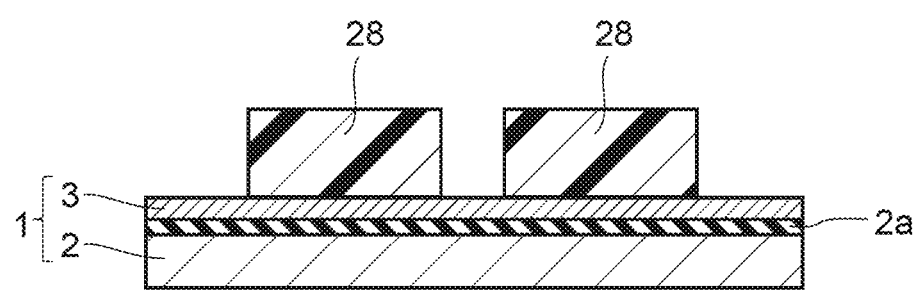
FIG. 14(a) is a sectional view showing a manufacturing step subsequent to that in FIG. 13.
FIG. 14(b) is a sectional view showing a manufacturing step subsequent to that in FIG. 14(a)
Figure 14:
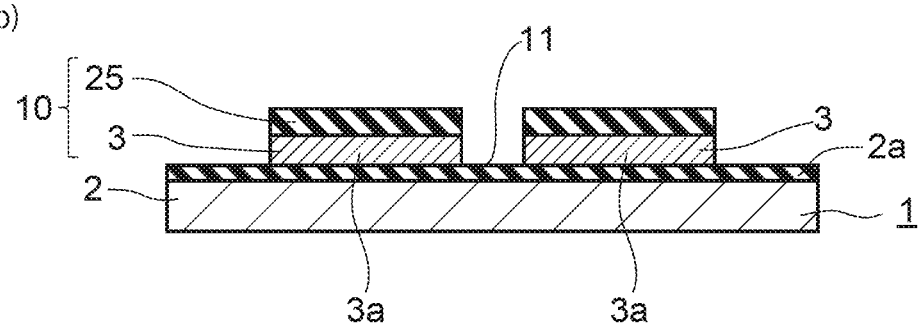

Subsequently, an element section forming step is performed. In the element section forming step, as illustrated in FIG. 13, a photoresist is applied on the surface of the thin-film piezoelectric material substrate 1 to form a photoresist layer 27 on the surface of the thin-film laminated part 3.

Next, as illustrated in FIG. 14(a), patterning is performed with a not-illustrated photomask, so as to form a resist pattern 28.

After that, using this resist pattern 28 as a mask, milling, RIE or etching is performed about the thin-film laminated part 3, so as to remove needless part of it.

Then, the thin-film laminated part 3 are divided into a plurality of element regions 3a via gap part 11, as illustrated in FIG. 14(a). The above-described element section 10 is formed from each element region 3a.

Further, later-described electrode forming step is performed. Next, a protecting insulating 25 made of polyimide is formed on each element region 3a, as illustrated in FIG. 14(b), a plurality of element section 10 are formed on the surface of insulator on Si substrate 2.

Then, in the electrode forming step, the contact via hole 21 is formed in the protecting insulating layer 25, and the piezoelectric material film 13 is removed to form contact via hole 21 in each element section 10. Further, in each element section 10, the lower terminal electrode 19a and upper terminal electrode 19b are formed of plating or the like on the lower electrode film 17 and upper electrode film 27 respectively. Thereby the thin-film piezoelectric material substrate 1 illustrated in FIG. 1, FIG. 2 is manufactured.

Furthermore, in case of HDD, the insulator on Si substrate 2 is removed from the thin-film piezoelectric material substrate 1 to form the plurality of thin-film piezoelectric elements 12b. For example, the thin-film piezoelectric elements 12b is adhered to the surface of base insulating layer 5 of HGA 101.

In MEMS case, in the backside of the insulator on Si substrate 2, a predetermined resist pattern is formed to remove the Si wafer or to perform the patterning of Si wafer, in design area by RIE. This time, the insulating layer 2a of insulator on Si substrate 2 will serve as a stopper layer for RIE process. The same insulating layer 2a on insulator on Si substrate 2 will also serve as a function layer together with the piezoelectric material film 13.

Example

Subsequently, the thin-film piezoelectric material substrate 1 is explained concretely with reference to FIG. 6-FIG. 9. The present inventors manufactured a plurality of thin-film piezoelectric material substrate while changing constitution of the substrate for deposition and evaporation temperature in the above-described YZ seed layer forming step to a plurality of the thin-film piezoelectric material substrates. The present inventors measured diffraction intensities about respective thin-film piezoelectric material substrate, by X-ray diffraction of θ-2θ method (XRD) with Cu-Kα ray. The results are shown in FIG. 6-FIG. 9.

Figure 6:
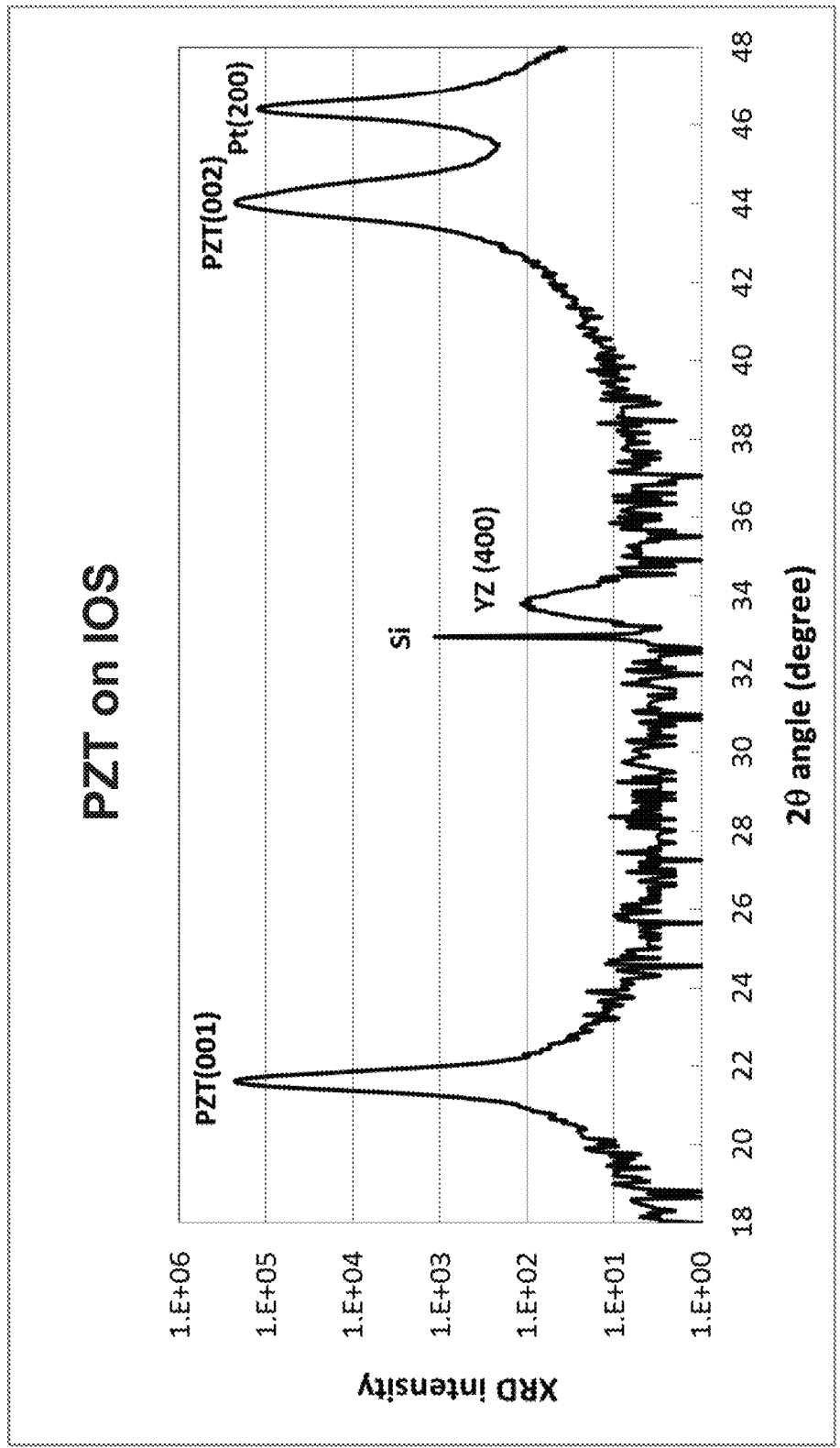
FIG. 6 is a graph showing measurement result of diffraction intensity by XRD about the thin-film piezoelectric material substrate.

FIG. 6 is a graph showing the measurement result of diffraction intensity by XRD about the thin-film piezoelectric material substrate 1. As illustrated in FIG. 6, it is able to be confirmed that the piezoelectric material film 13 made of PZT has diffraction intensity peaks of (001) plane and (002) plane only, in the thin-film piezoelectric material substrate 1. Further, it is able to be confirmed that the YZ seed layer 15 has diffraction intensity peak of (400) plane only. Furthermore, it is able to be confirmed that the lower electrode film 17, made of Pt, has diffraction intensity peak of (200) plane only.

Figure 7:
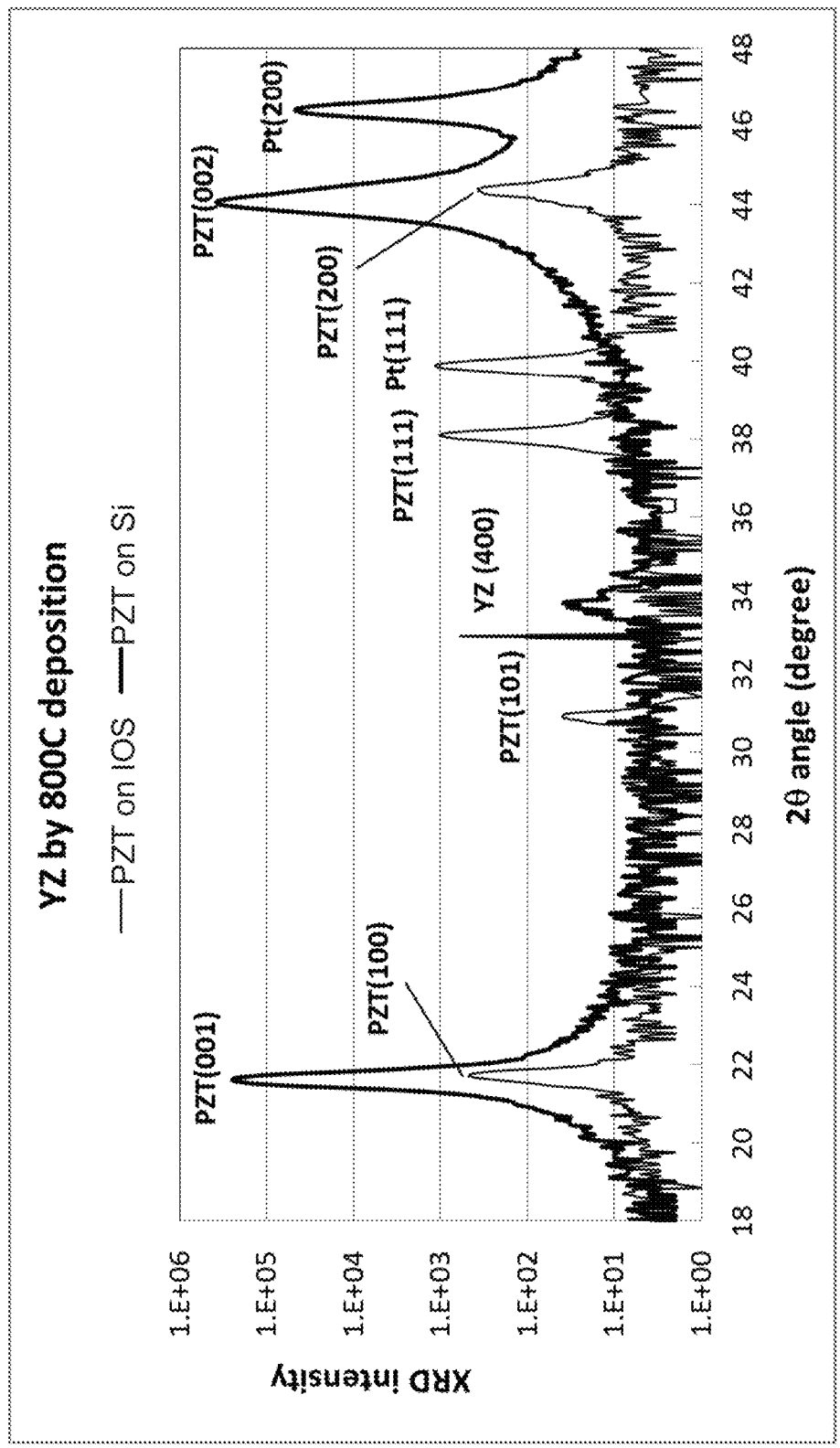
FIG. 7 is a graph showing measurement result of diffraction intensity by XRD about the piezoelectric material element formed on an insulator on Si substrate, and on a silicon single crystal substrate having YZ seed layer respectively.

FIG. 7 is a graph showing measurement result of diffraction intensity by XRD about the insulating substrate being formed of the YZ seed layer by 800° C. of evaporation temperature ("PZT ON IOS") and a silicon single crystal substrate being formed of the YZ seed layer by 800° C. of evaporation temperature ("PZT ON Si").

As illustrated in FIG. 7, it is able to be confirmed that even if the YZ seed layer is formed by 800° C. of evaporation temperature, the YZ seed layer 15 has diffraction intensity peak of (400) plane, the piezoelectric material film has diffraction intensity peak of (001) plane and (002) plane, about the silicon single crystal substrate.

On the other hand, it is able to be confirmed that the piezoelectric material film 13 has diffraction intensity peak of (100) plane, (101) plane, (111) plane and (200) plane, about the insulator on Si substrate 2.

However, it is not able to be confirmed that the piezoelectric material film 13 has diffraction intensity peak of only (001) plane and (002) plane, about the insulator on Si substrate 2. Instead, diffraction intensity peaks of other PZT planes also exist. Further, it is not able to be confirmed that YZ seed layer 15 has diffraction intensity peak.

Figure 8:
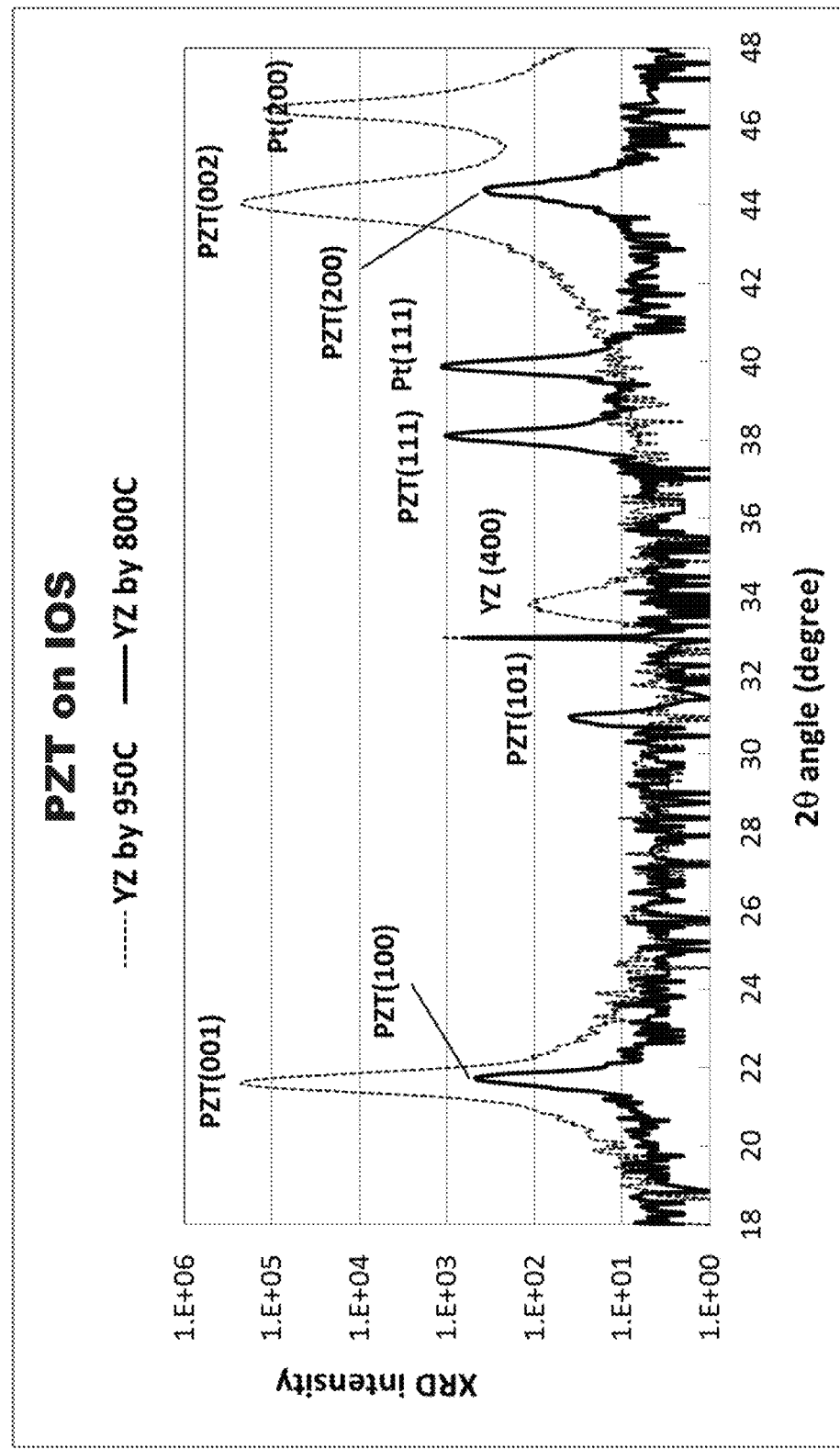
FIG. 8 is a graph showing measurement result of diffraction intensity by XRD of PZT on insulator on Si substrate which the YZ seed layer is formed at 800° C. and 950° C. deposition temperature, respectively.

Accordingly, it becomes clear that even if 800° C. of evaporation temperature is sufficient for formation of following a), b) on the silicon single crystal substrate, 800° C. of evaporation temperature is not sufficient for formation of following a), b) on the insulator on Si substrate 2.

a) YZ seed layer having diffraction intensity peak of (400) plane
b) piezoelectric material film having diffraction intensity peak of (001) plane and (002) plane only FIG. 8 is a graph showing measurement result of diffraction intensity by XRD about the insulator on Si substrate which the YZ seed layer is formed with 800° C. evaporation temperature and the insulator on Si substrate which the YZ seed layer is formed with 950° C. evaporation temperature. As illustrated in FIG. 8, diffraction intensity peak of YZ seed layer is not able to be confirmed, about the insulator on Si substrate which the YZ seed layer is formed with 800° C. evaporation temperature.

However, it is able to be confirmed that YZ seed layer has diffraction intensity peak of (400) plane about the insulator on Si substrate which the YZ seed layer is formed with 950° C. evaporation temperature. Further, it is also able to be confirmed that the piezoelectric material film 13 has diffraction intensity peak of (001) plane and (002) plane only.

As mentioned above, 800° C. of evaporation temperature is not sufficient for crystallization of the YZ seed layer 15 on the insulator on Si substrate 2. However, when evaporation temperature rises to high temperature 900° C. or exceeds 900° C., as illustrated in FIG. 8, it is able to be confirmed that the YZ seed layer 15, having diffraction intensity peak of (400) plane, is formed. Accordingly, it is conceivable that when evaporation temperature rises to high temperature 900° C. or exceeds 900° C., crystallization of the YZ seed layer 15 starts on the insulator on Si substrate 2. Therefore, the YZ seed layer 15 is formed on the insulator on Si substrate 2 by high temperature evaporation with 900° C. or exceeds 900° C.

Further, the present inventors formed three kinds of YZ seed layers 15 by 800° C., 900° C., 950° C. of evaporation temperatures and they measured the diffraction intensity peak of (001) plane of the piezoelectric material film 13, by Lotgering method. The result is illustrated in FIG. 9.

As illustrated in FIG. 9, it is able to be confirmed that when evaporation temperature of the YZ seed layer 15 is 800° C., orientation degree is only 0.4, but when evaporation temperature of the YZ seed layer 15 is 900° C. or 950° C., orientation degree reaches 1.0. Accordingly, it is conceivable that if evaporation temperature of the YZ seed layer 15 reaches 900° C. or exceeds 950° C., the piezoelectric material film 13, orientated (001) plane direction, is formed.

As described above, when the YZ seed layer 15 satisfying the above-described condition about evaporation temperature is formed on the insulating layer 2a of the insulator on Si substrate 2, the piezoelectric material film 13, orientated (001) plane, is formed by epitaxial growth. The piezoelectric material film 13, being formed the above-described manner, is a PZT thin-film having all of the above-described A), B), C). If evaporation temperature is less than 800° C., even if it exceeds 800° C., but does not reach 900° C., PZT thin-film, orientated (001) plane, is not formed.

Therefore, it needs for formation of the PZT thin-film having all of the above-described A), B), C) that evaporation temperature of the YZ seed layer 15 reach 900° C. or exceeds 900° C.

Further, as illustrated in FIG. 7, it is able to be confirmed that when the YZ seed layer 15 is formed on the insulator on Si substrate 2 by the above-described evaporation temperature, the piezoelectric material film 13, orientated (001) plane, is formed.

On the other hand, because the thin-film piezoelectric material element 12b has the lower diffusion bather film 16a and the upper diffusion barrier film 16b, diffusion barrier strength of the lower electrode film 17, the piezoelectric material film 13 and the upper electrode film 27 has been elevated. Furthermore, the concavity and convexity surface 13A of the piezoelectric material film 13 has the concavity and convexity structure, the upper diffusion barrier film 16b and the upper electrode film 27 have also concavity and convexity structure similar to this one. Then, because a contact area with another film is extended than the case each film is flat, diffusion barrier strength between each film has been more elevated.

Figure 20:
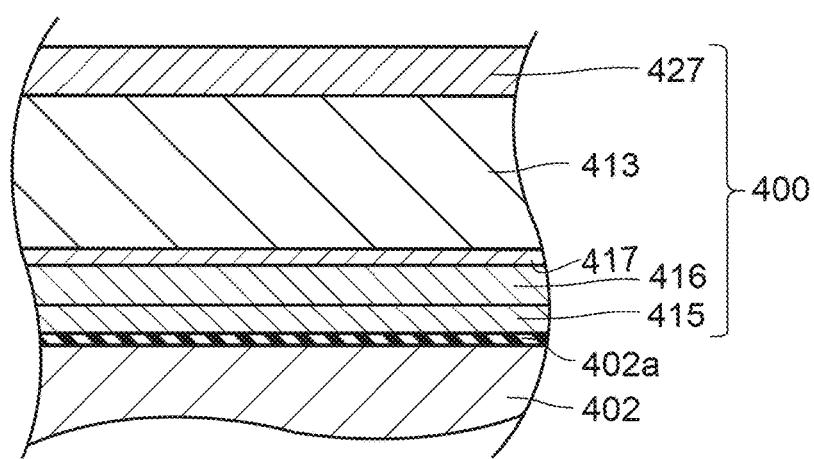
FIG. 20 is a sectional view showing a conventional thin-film piezoelectric material element.

Next, a conventional thin-film piezoelectric material element 400 is explained with reference to FIG. 20, FIG. 21. The thin-film piezoelectric material element 400 is formed on the insulator on Si substrate 402. The insulating substrate 402 has the silicon substrate and an insulating layer 402a formed on the surface of the silicon substrate. A lower seed layer 415, made of titanium or titanium oxide, is laminated on the top surface of the insulating layer 402a. A middle seed layer 416, made of Pt (111), is laminated on the lower seed layer 415, an upper seed layer 417, made of $PbTiO_3$, is laminated on the middle seed layer 416. Further, the PZT thin-film 413 is laminated on the upper seed layer 417, an upper electrode film 427, made of Pt, is laminated on the PZT thin-film 413.

Figure 21:
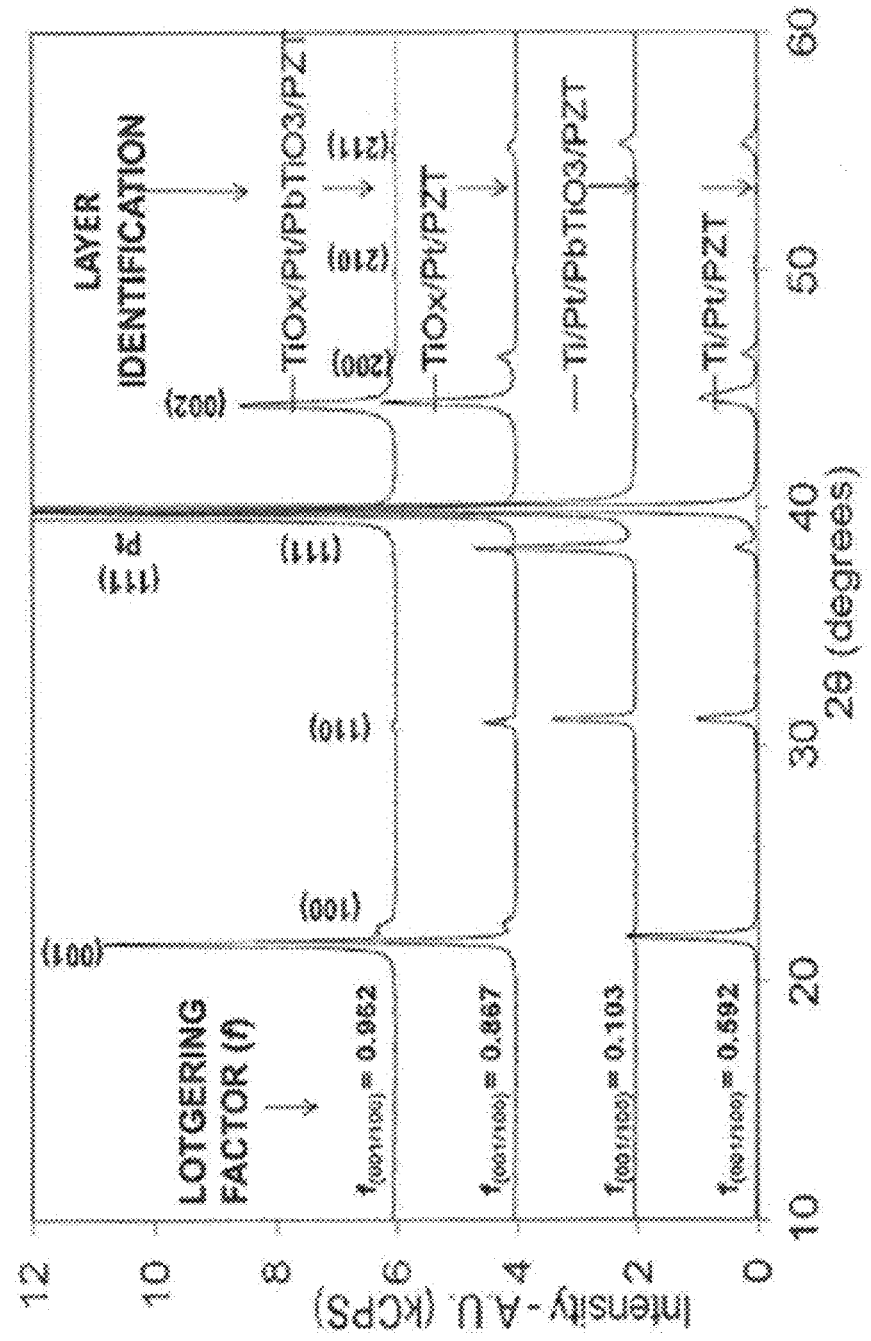
FIG. 21 is a graph showing measurement result of diffraction intensity by XRD about the conventional thin-film piezoelectric material element.

Measurement result by XRD about the thin-film piezoelectric material element 400 is illustrated in FIG. 21. As illustrated in FIG. 21, it is able to be confirmed that the PZT thin-film 413 has diffraction intensity peaks of (100), (200) plane in addition to diffraction intensity peaks of (001), (002) plane.

On the other hand, in case of the thin-film piezoelectric material element 12b according to the first embodiment of the present invention, as mentioned above, it is able to be confirmed that the piezoelectric material film 13 has diffraction intensity peaks of (001), (002) plane only, but it is not able to be confirmed that the piezoelectric material film 13 has another diffraction intensity peaks. Accordingly, about the thin-film piezoelectric material element 12b, it is clear that crystal structure is oriented along the (001) direction.

Embodiment of Head Gimbal Assembly

Figure 15:
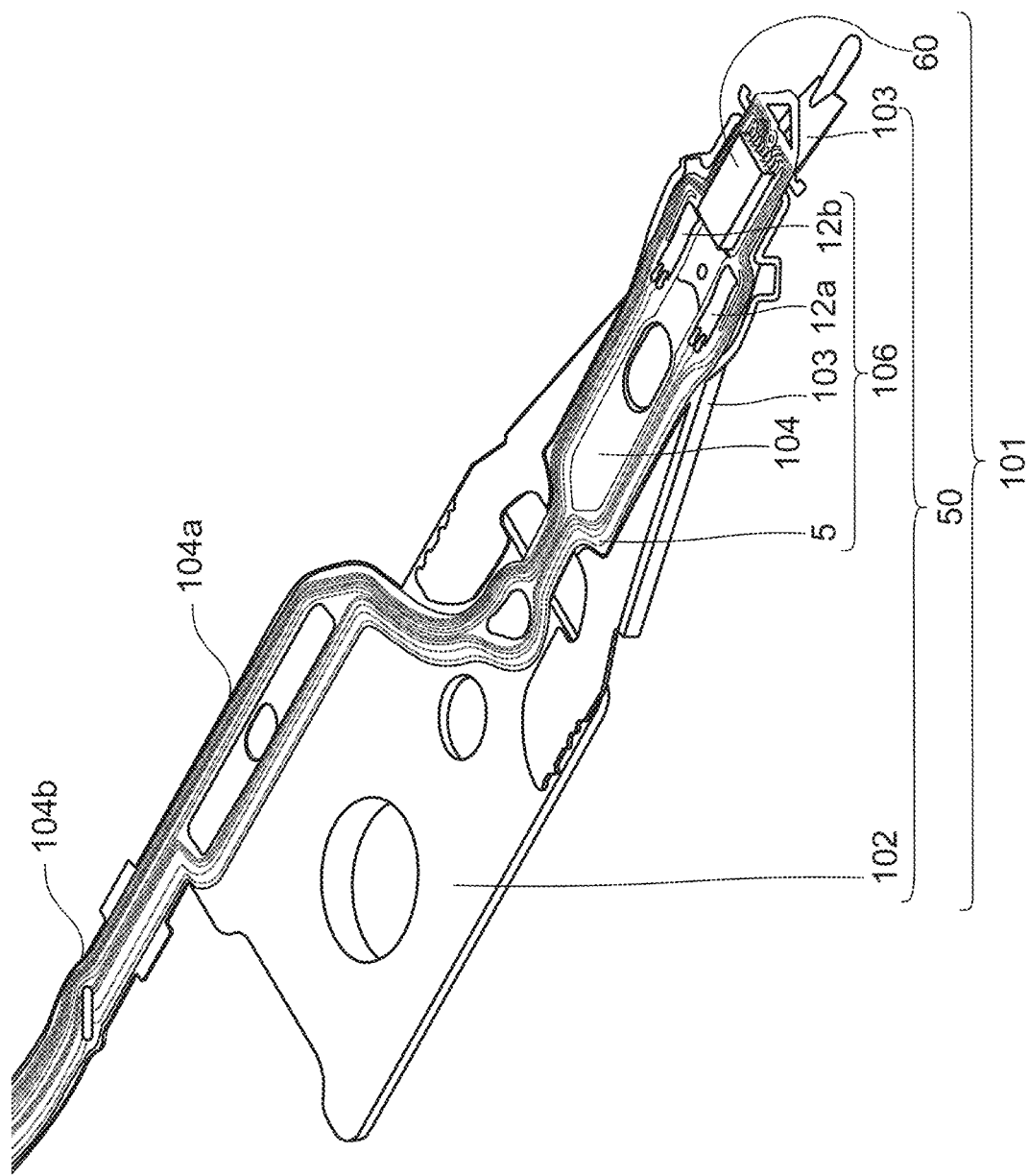
FIG. 15 is a perspective view showing a whole HGA, from front side, according to the first embodiment of the present invention.
Figure 16:
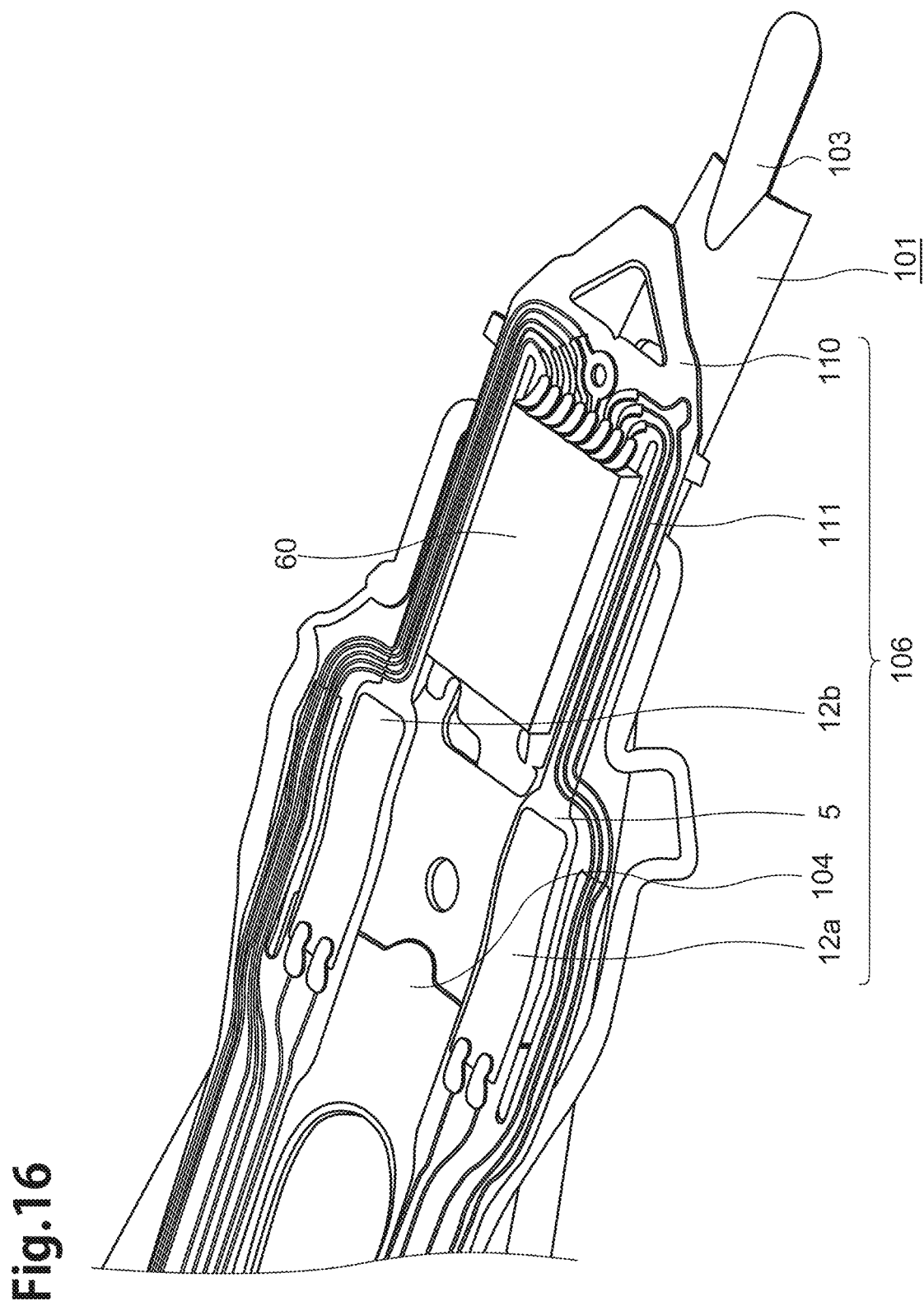
FIG. 16 is a perspective view showing, from front side, a principal part of the HGA in FIG. 15.
Figure 17:
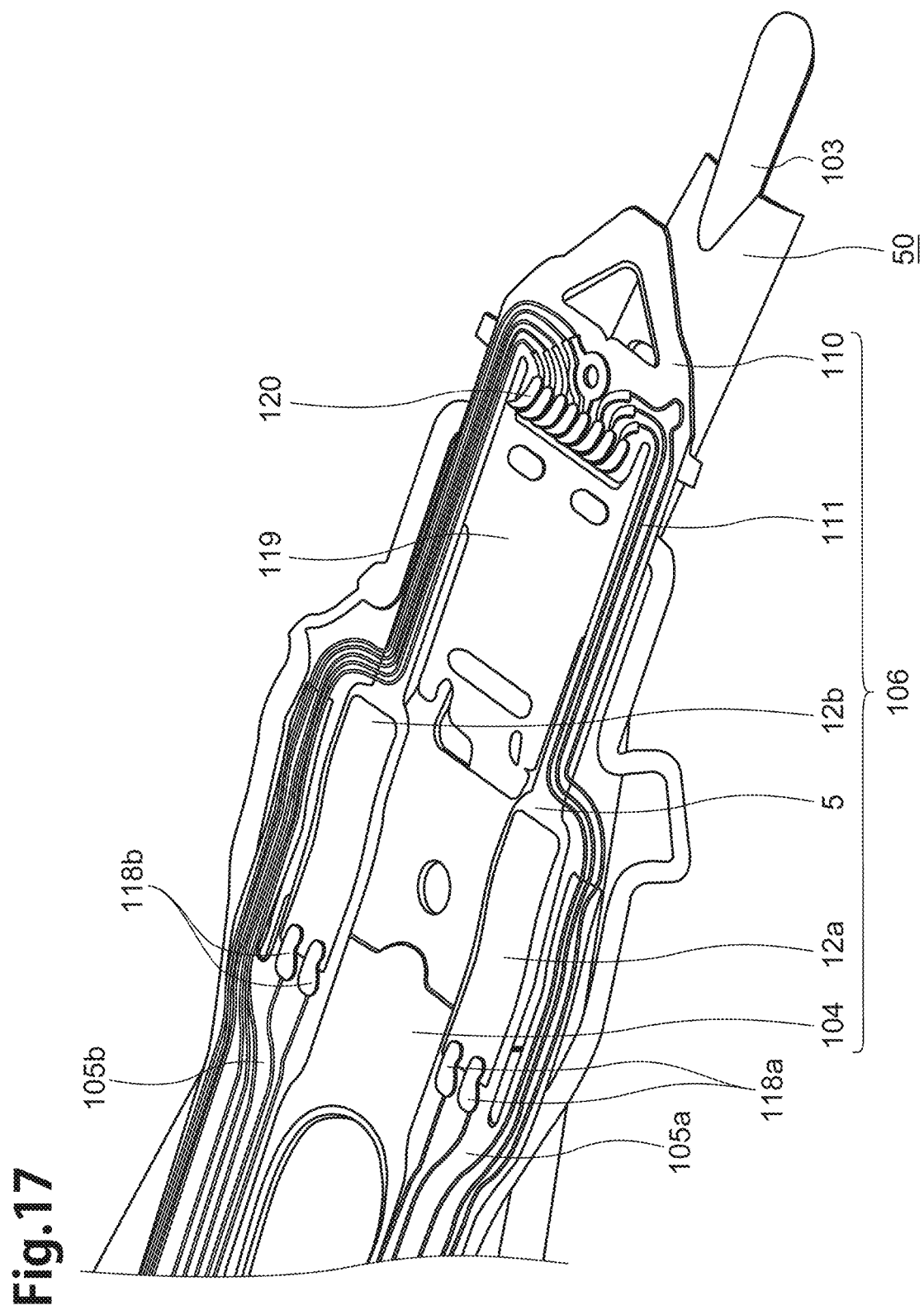
FIG. 17 is a perspective view showing a principal part of a suspension constituting the HGA in FIG. 15 from front side.

To begin with, a structure of the HGA according to the first embodiment of the present invention will be explained with reference to FIG. 15 to FIG. 18, in addition to the above-described FIG. 5. Here, FIG. 15 is a perspective view showing a whole of the HGA 101, from front side, according to the first embodiment of the present invention. FIG. 16 is a perspective view showing a principal part of the HGA 101 from front side. FIG. 17 is a perspective view showing a principal part of the suspension 50 constituting the HGA 101 from front side. Further, FIG. 18 is a perspective view showing a part, which a thin-film piezoelectric material element 12b is fixed, of a flexure 106 with enlargement.

As illustrated in FIG. 15, the HGA 101 has the suspension 50 and a head slider 60. The suspension 50 has a base plate 102, a load beam 103, the flexure 106 and a dumper not illustrated, and it has a structure which these parts are joined to be united one body by a weld and so on.

The base plate 102 is a part which is used to fix the suspension 50 to a drive arms of a not-illustrate hard disk drive, and it is formed with a metal such as stainless steel or the like.

The load beam 103 is fixed on the base plate 102. The load beam 103 has a shape in which the width gradually decreases as it is distanced more from the base plate 102. The load beam 103 has a load bending part which generates a power for pressing the head slider 60 against the hard disk of the hard disk drive.

Further, as illustrated in FIG. 15 to FIG. 18, the flexure 106 has a flexure substrate 104, a base insulating layer 5, a connecting wiring 111, thin-film piezoelectric material elements 12a, 12b and the protecting insulating layer 25. The flexure 106 has a structure which the base insulating layer 5 is formed on the flexure substrate 104, the connecting wiring 111 and thin-film piezoelectric material elements 12a, 12b are adhered on the base insulating layer 5. Further, the protective insulating layer 25 is formed so as to cover the connecting wiring 111 and thin-film piezoelectric material elements 12a, 12b.

The flexure 106 has a piezoelectric elements attached structure which thin-film piezoelectric material elements 12a, 12b are fixed on the surface of the base insulating layer 5 in addition to the connecting wiring 111 to become a structure with piezoelectric element.

Further, the flexure 106 has a gimbal part 110 on the tip side (load beam 103 side). A tongue part 119, which the head slider 60 is mounted, is secured on the gimbal part 110, and a plurality of connecting pads 120 are formed near an edge side than the tongue part 119. Connecting pads 120 are electrically connected to not-illustrated electrode pads of the head slider 60.

This flexure 106 expands or shrinks thin-film piezoelectric material elements 12a, 12b and expands or shrinks stainless part (referred to out trigger part) jut out outside of the tongue part 119. That makes a position of the head slider 60 move very slightly around not-illustrated dimple, and a position of the head slider 60 is controlled minutely.

The flexure substrate 104 is a substrate for supporting a whole of the flexure 106, and it is formed with stainless. Rear side of the flexure substrate 104 is fixed to the base plate 102 and the load beam 103 by weld. As illustrated in FIG. 15, the flexure substrate 104 has a center part 104a fixed to surfaces of the load beam 103 and the base plate 102, and a wiring part 104b extending to outside from the base plate 102.

The base insulating layer 5 covers surface of the flexure substrate 104. The base insulating layer 5 is formed with for example polyimide, and it has a thickness of about 5 μm to 10 μm. Further, as illustrated in detail in FIG. 17, a part of the base insulating layer 5, disposed on the load beam 103, is divided two parts. One part of them is a first wiring part 105a, the other part of them is second wiring part 105b. The thin-film piezoelectric material element 12a and thin-film piezoelectric material element 12b are adhered on surfaces of each wiring part. The above-described upper terminal electrode 19a and lower terminal electrode 19b of the thin-film piezoelectric material element 12a, 12b are connected to the electrode pads 118a, 118b. The electrode pads 118a, 118b are connected to the connecting wiring 111.

A plurality of connecting wirings 111 are formed on surfaces of each of the first wiring part 105a and the second wiring part 105b. Each connecting wiring 111 is formed with conductor such as copper or the like. One end parts of each connecting wiring 111 are connected to the electrode pads 118a, 118b or each connecting pad 20.

Further, a not illustrated thin-film magnetic head, which re records and reproduces data, is formed on the head slider 60. Furthermore, a plurality of not illustrated electrode pads are formed on the head slider 60, and each electrode pad is connected to the connecting pad 120.

Because the HGA 101 is formed with the above-described thin-film piezoelectric material element 12a, 12b, the HGA 101 is able to be manufactured efficiently. Further, because, the piezoelectric material film 13 has a large piezoelectric property, minute position control by the HGA 101 is performed.

Embodiments of Ink Jet Head

Next, embodiments of the Ink Jet Head will now be explained with reference to FIG. 19.

Figure 19:
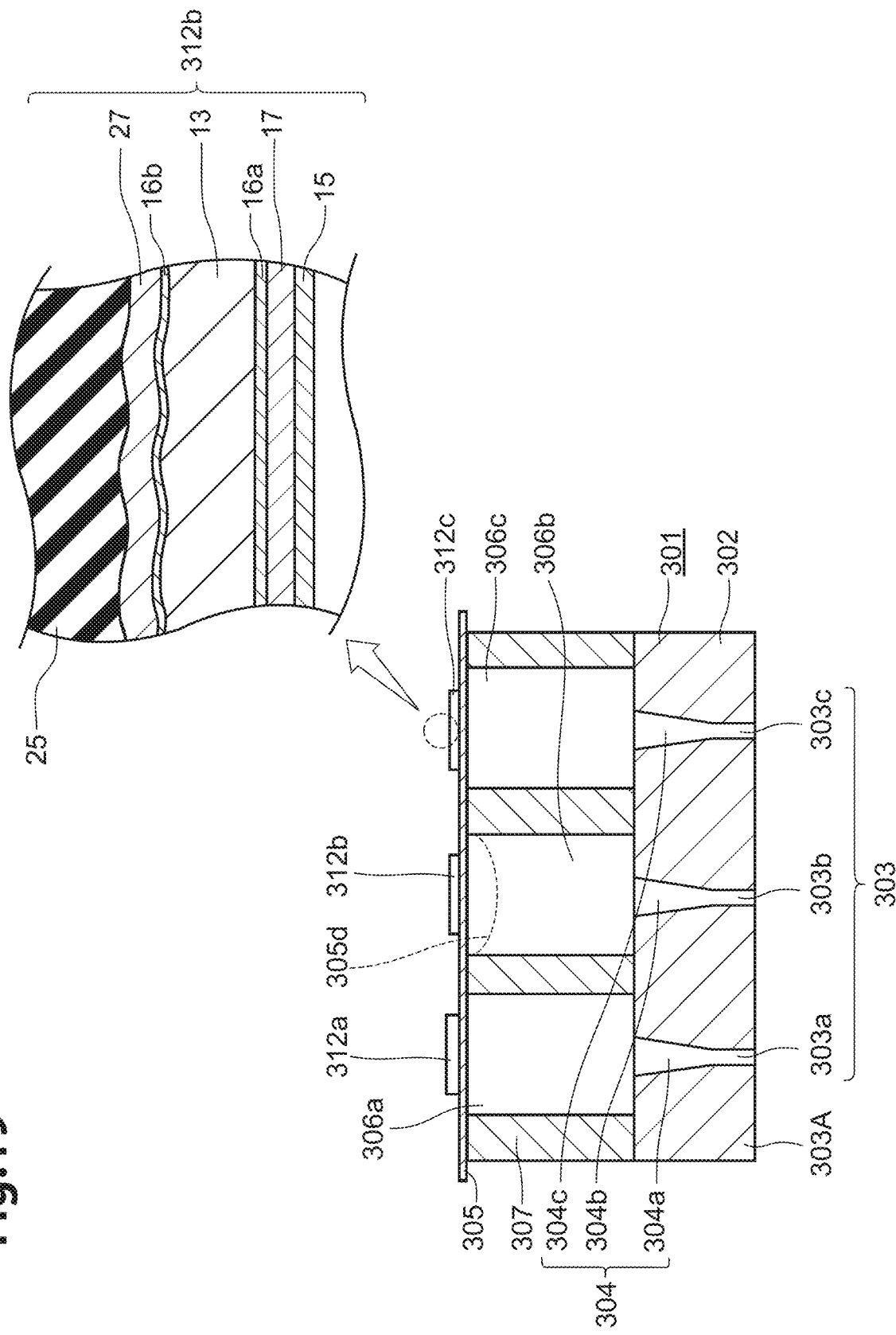
FIG. 19 is a sectional view showing a summary constitution of the ink jet head according to the first embodiment of the present invention.

FIG. 19 is a sectional view showing a summary constitution of the ink jet head 301. The ink jet head 301 is manufactured with thin-film piezoelectric material elements 312a, 312b, 312c. The ink jet head 301 has a head main body part 302, thin-film piezoelectric material elements 312a, 312b, 312c, a vibration member 305, a plurality of ink chambers 306a, 306b, 306c and a side wall part 307.

The head main body part 302 has a substrate 303A. A plurality of nozzles 303a, 303b, 303c and ink passages 304a, 304b, 304c (3 pieces in FIG. 19) are formed in the substrate 303A.

The plurality of ink chambers 306a, 306b, 306c are formed so as to correspond to the each nozzle 303a, 303b, 303c and the each ink passage 304a, 304b, 304c. Each ink chamber 306a, 306b, 306c is partitioned by the side wall part 307, and each of them communicates via nozzles 303a, 303b, 303c through ink passages 304a, 304b, 304c. Ink, not illustrated, is accommodated in each ink chamber 306a, 306b, 306c. The head main body part 302 is able to be manufactured with a various kinds of material such as resin, metal, silicon (Si) substrate, glass substrate, ceramics or the like.

The vibration member 305 is adhered to the side wall part 307 so as to cover a plurality of ink chambers 306a, 306b, 306c. The vibration member 305 is formed with silicon oxide (SiO) for example, and it has a thickness of about 3.5 μm. Then, thin-film piezoelectric material elements 312a, 312b, 312c are adhered to the outside of the vibration member 305 so as to correspond to the each ink chambers 306a, 306b, 306c. Thin-film piezoelectric material elements 312a, 312b, 312c are adhered to the vibration member 305 with adhesive.

The structure of each thin-film piezoelectric material element 312a, 312b, 312c is the same as the structure of the above-described thin-film piezoelectric material element 12b. Further, each thin-film piezoelectric material element 312a, 312b, 312c has not-illustrated electrode terminals. Not-illustrated wiring is connected to each electrode terminal.

The head main body part 302 and the ink jet head 301 are able to be manufactured as follows. To begin with, nozzles 303a, 303b, 303c and ink passages 304a, 304b, 304c are formed on the substrate 303A by machining.

Next, the side wall part 307, which ink chambers 306a, 306b, 306c are formed by machining or etching, is adhered to the substrate 303A. Or the side wall part 307 is formed on the substrate 303A by plating. After that, the vibration member 305, which thin-film piezoelectric material elements 312a, 312b, 312c are adhered, is adhered to the side wall part 307. Then the ink jet head 301 is manufactured.

When electric power is supplied to thin-film piezoelectric material elements 312a, 312b, 312c via the wiring and electrode terminal from a not-illustrated power source concerning the ink jet head 301 manufactured as the above, as illustrated in FIG. 19, for example, transformation of the thin-film piezoelectric material elements 312b makes a curved part 305d in the vibration member 305. Then, the ink accommodated in each ink chamber 306a, 306b, 306c is pushed out, and the ink is ejected via ink passages 304a, 304b, 304c and nozzles 303a, 303b, 303c.

Because the thin-film piezoelectric material elements 312a, 312b, 312c have constitution similar to the above-described thin-film piezoelectric material elements 12b, the ink jet head 301 is manufactured efficiently. Further, because the piezoelectric material film 13 has high heat-resistant, ink jet head 301 operates accurately and reliably.

Further, in the ink jet head 301, limitation for material of the head main body part 302 is reduced than a case which a lower electrode film, a piezoelectric material film and an upper electrode film are formed on a silicon substrate and ink passages and nozzles are formed on the silicon substrate by reactive ion etching or the like, so various kinds of material are able to be used for the head main body part 302. Therefore, the method with low cost than a processing such as reactive ion etching or the like is able to be used when the head main body part 302 is manufactured, the ink jet head 301 is manufactured easily. Further, nozzles and ink passages are formed respectively with another substrates, and nozzles and ink passages are joined together, after that, the thin-film piezoelectric material element is adhered to them, thereby the ink jet head is able to be manufactured, though they are not illustrated. In this case, nozzles are able to be formed by machining and ink passages are able to be formed by plating.

Furthermore, the thin-film piezoelectric material elements 312a, 312b, 312c, vibration member 305, ink chambers 306a, 306b, 306c, and sidewall part 307 can be all in one part made of the thin-film piezoelectric substrate, then attached to the head main body part 302. This can be done by backside patterning using a photo mask the insulator on Si substrate 2, then RIE remove the Si to form the ink chambers 306a, 306b, 306c. As the RIE stopper, the insulating layer 2a also serves as the vibration member. This method simplified the attachment complexity and greatly enhanced the alignment accuracy.

Second Embodiment

Figure 22:
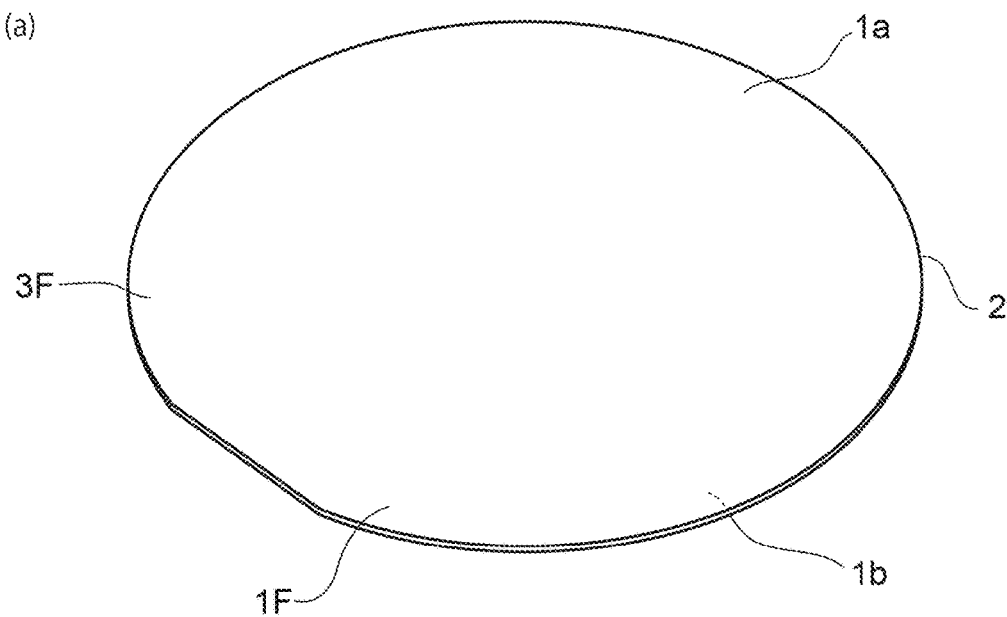
FIG. 22(a) is a perspective view showing whole of the thin-film piezoelectric material substrate, according to the second embodiment of the present invention.
FIG. 22(b) is a plan view, with enlargement, showing the surface of the thin-film piezoelectric material substrate after forming of element sections.
Figure 22:
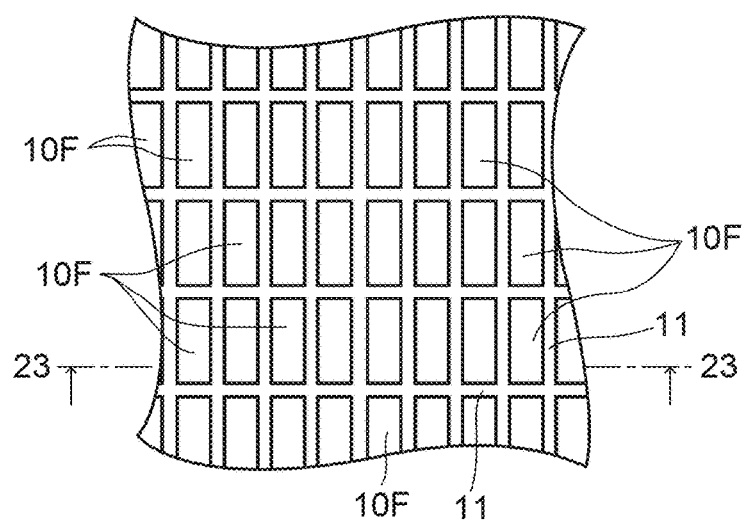

Thin-Film Piezoelectric Material Substrate,
Thin-Film Piezoelectric Material Element, HGA Next, a thin-film piezoelectric material substrate 1F and thin-film piezoelectric material element 12bF, according to the second embodiment, will be explained with reference to FIG. 22, FIG. 23.

As illustrated in FIG. 22(a), the thin-film piezoelectric material substrate 1F, according to the second embodiment, is different in that a thin-film laminated part 3F is formed on the insulator on Si substrate 2 in place of the thin-film laminated part 3, as compared with the above-described thin-film piezoelectric material substrate 1.

Figure 23:
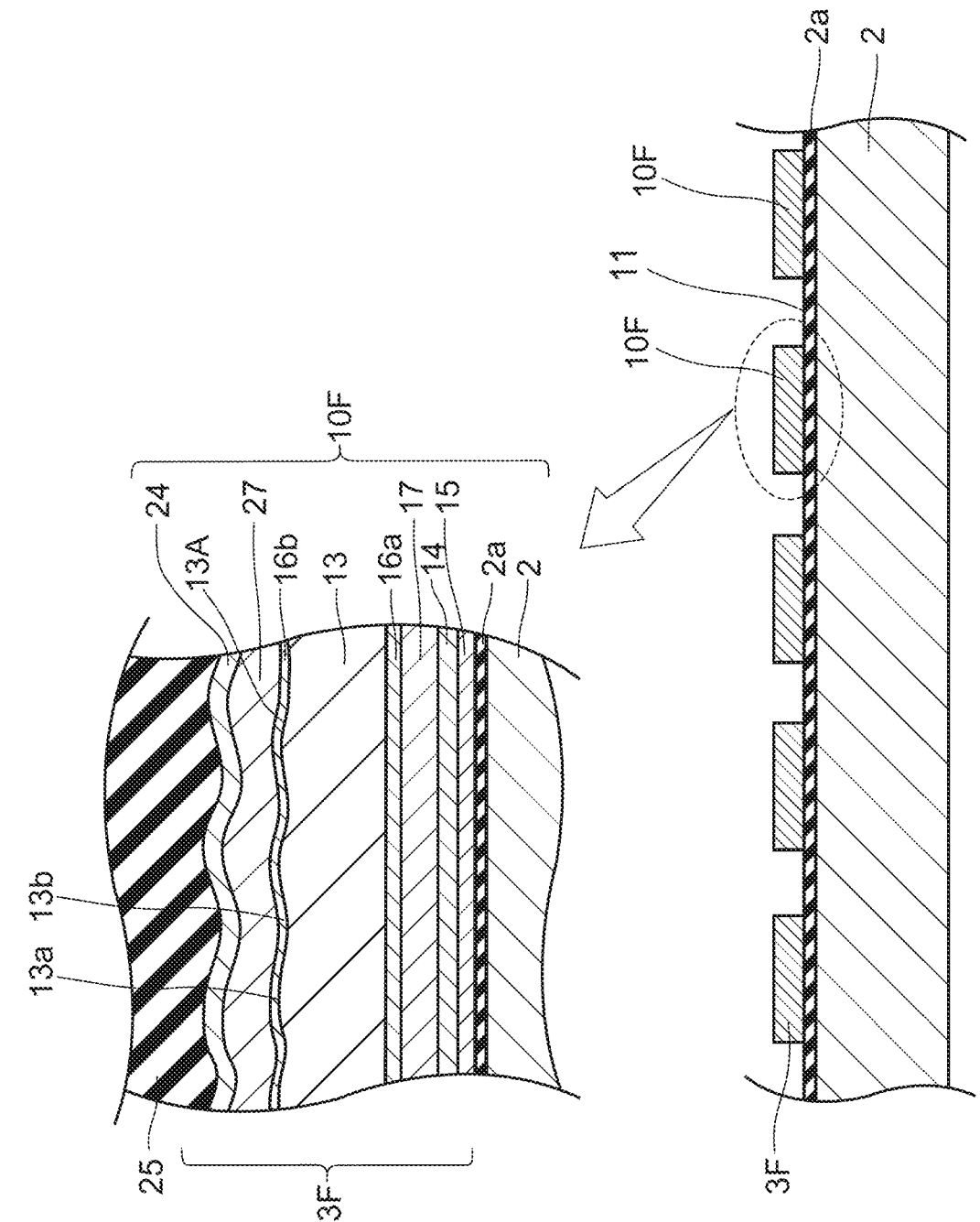
FIG. 23 is a sectional view taken along the line 23-23 in FIG. 22(b)

As illustrated in FIG. 23, the thin-film laminated part 3F is different in that it has a lower piezoelectric-material protective-film 14 and an upper piezoelectric-material protective-film 24, as compared with the thin-film laminated part 3.

The thin-film piezoelectric material substrate 1F also includes a substrate, which a plurality of later-described element sections 10F are not formed (FIG. 22(a)) in the thin-film laminated part 3F, and a substrate, which a plurality of element sections 10F are formed in the thin-film laminated part 3F (FIG. 22(b)). As illustrated in FIG. 22(b), when the plurality of element sections 10F are formed in the thin-film laminated part 3F, the later-described thin-film piezoelectric material elements 12bF are formed from each of the element sections 10F. Therefore, the element sections 10F, for forming the thin-film piezoelectric material elements 12bF, are arranged on the thin-film piezoelectric material substrate 1F.

Then, the element section 10F is different in that it has the lower piezoelectric-material protective-film 14 and the upper piezoelectric-material protective-film 24, as compared with the above-described element section 10. The lower piezoelectric-material protective-film 14 and the upper piezoelectric-material protective-film 24 are laminated so as to sandwich the lower electrode film 17, the upper electrode film 27, the lower diffusion barrier film 16a, the upper diffusion barrier film 16b and the piezoelectric material film 13, in the respective element sections 10F. The lower piezoelectric-material protective-film 14, upper piezoelectric-material protective-film 24 are polycrystal thin-films (thickness about 100 nm) using alloy material.

The lower piezoelectric-material protective-film 14 is laminated on the lower side of the lower electrode film 17 (the side of the insulator on Si substrate 2) and the upper side of the YZ seed layer 15, namely, it is laminated between the YZ seed layer 15 and the lower electrode film 17.

The upper piezoelectric-material protective-film 24 is laminated on the upper side of the upper electrode film 27 (the side of the protective insulating layer 25), namely, it is laminated between the upper electrode film 27 and the protective insulating layer 25.

The lower piezoelectric-material protective-film 14, the upper piezoelectric-material protective-film 24 are formed with alloy material which has iron (Fe) as main ingredient, for example. It is preferable that crystal structures of the lower piezoelectric-material protective-film 14, the upper piezoelectric-material protective-film 24 are body-centered cubic structure. It is preferable that the lower piezoelectric-material protective-film 14, the upper piezoelectric-material protective-film 24 are formed with alloy material which include Fe and at least any one of Co, Mo, Au, Pt, Al, Cu, Ag, Ta, Cr, Ti, Ni, Ir, Nb, Rb, Cs, Ba, V, W, Ru. Further, it is more preferable that the lower piezoelectric-material protective-film 14, the upper piezoelectric-material protective-film 24 are formed with alloy material which includes Fe and Co, Mo. The lower piezoelectric-material protective-film 14, the upper piezoelectric-material protective-film 24 are able to be formed by PVD (Physical Vapor Deposition) such as IBD (Ion Beam Deposition), sputtering, Vacuum Evaporation, MBE (Molecular Beam Epitaxy), Ion Plating or the like.

Because the upper surface of the upper electrode film 27 is the concavity and convexity surface 13A (see FIG. 2), the upper surface and lower surface of the upper piezoelectric-material protective-film 24 are concavity and convexity surface in accordance with the concavity and convexity surface 13A of the piezoelectric material film 13.

Figure 24:
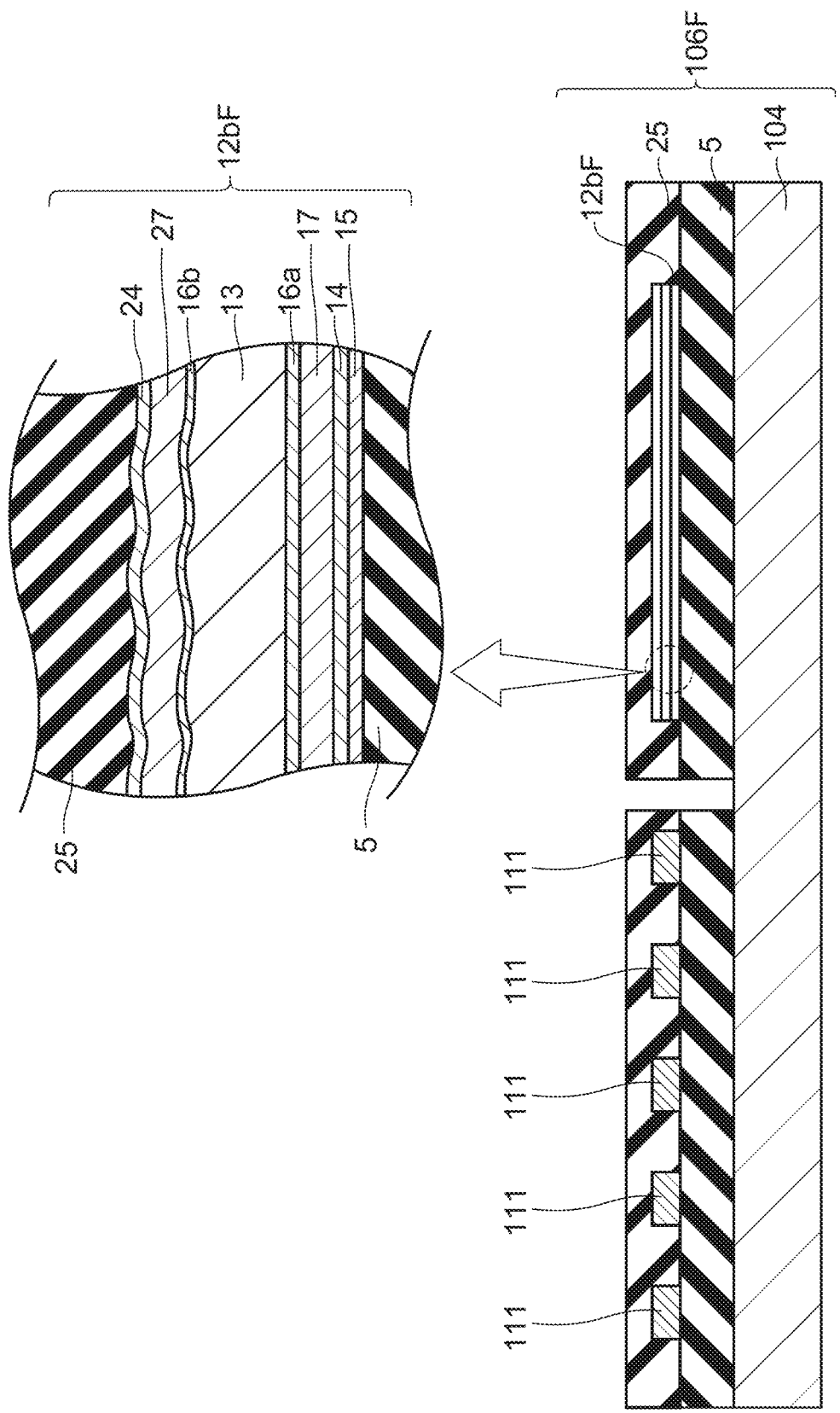
FIG. 24 is a sectional view taken along the line 24-24 in FIG. 25.
Figure 26:
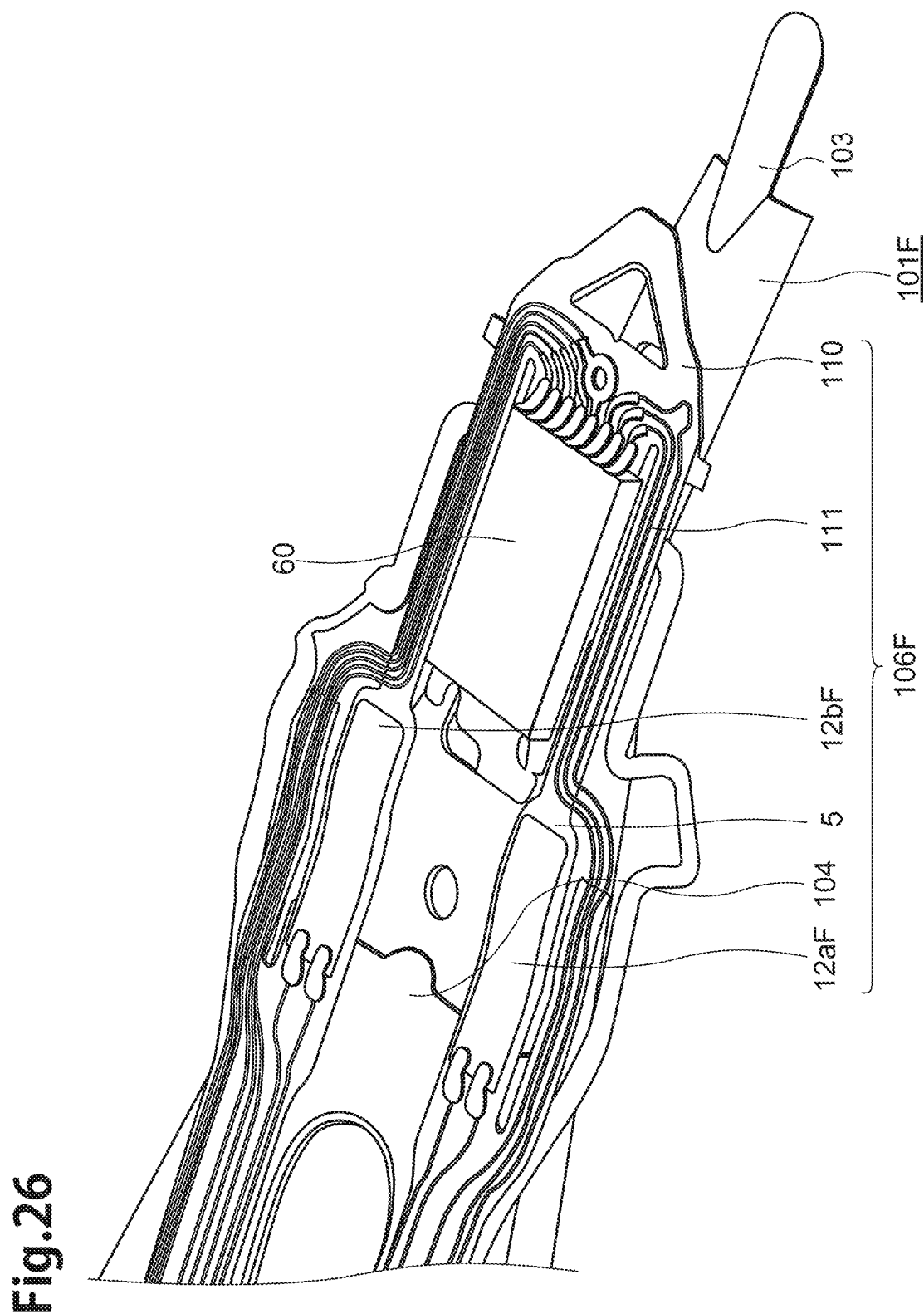
FIG. 26 is a perspective view showing, from front side, a principal part of the HGA, according to the second embodiment of the present invention.

Then, as illustrated in FIG. 24, FIG. 26, the thin-film piezoelectric material element 12bF is adhered on the surface of the base insulating layer 5 of the HGA 101F. Because the thin-film piezoelectric material element 12bF is formed with the above-described respective element sections 10F, as illustrated in FIG. 24, the thin-film piezoelectric material element 12bF is different in that it has the lower piezoelectric-material protective-film 14 and the upper piezoelectric-material protective-film 24, as compared with the thin-film piezoelectric material element 12b. The thin-film piezoelectric material element 12aF is also different in that it has the lower piezoelectric-material protective-film 14 and the upper piezoelectric-material protective-film 24, as compared with the thin-film piezoelectric material element 12b.

Figure 25:
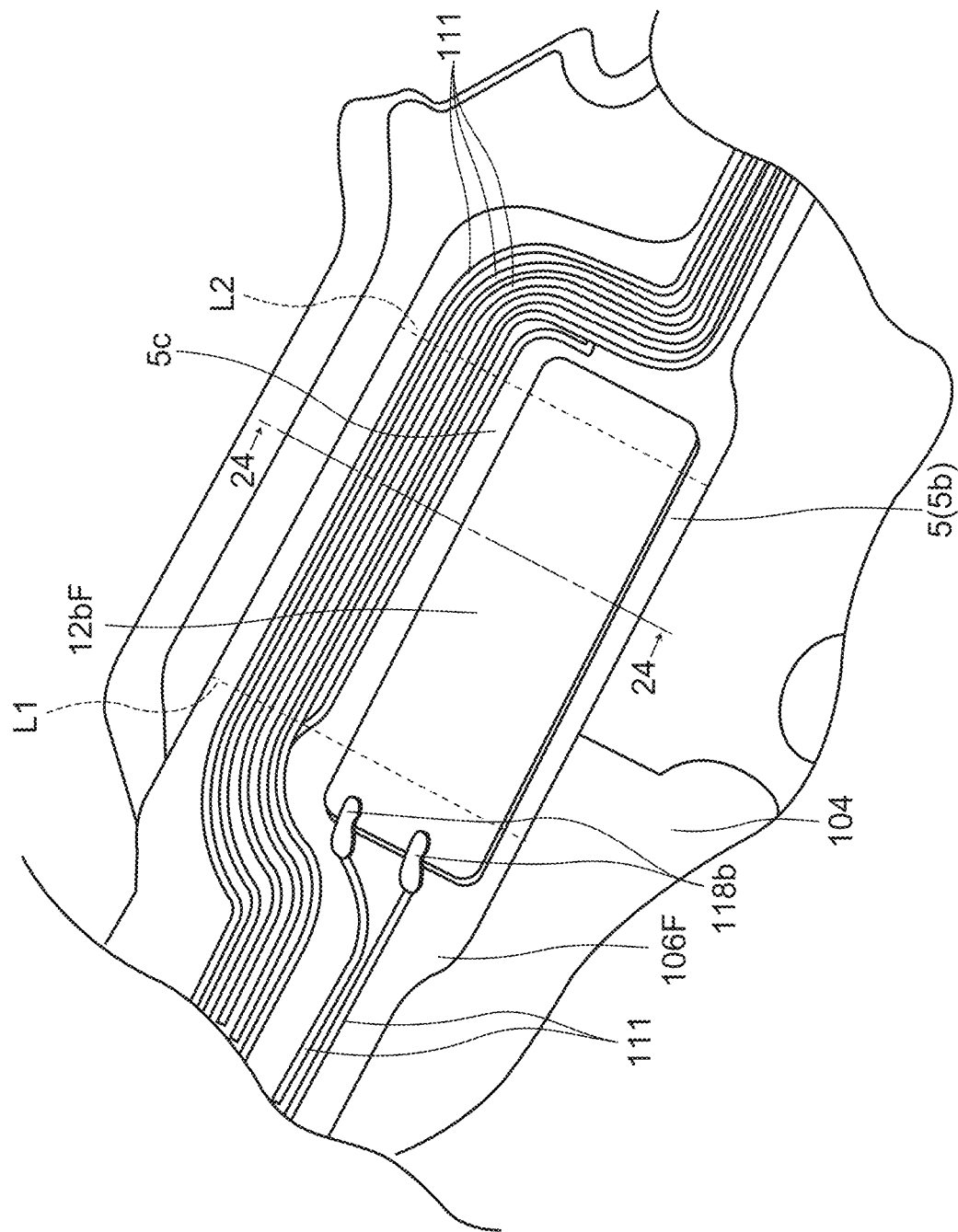
FIG. 25 is a perspective view, with enlargement, showing a part, of the flexure according to the second embodiment of the present invention, which the thin-film piezoelectric material element is fixed.

A flexure 106F and the HGA 101F are illustrated in FIG. 24, FIG. 25, FIG. 26. The flexure 106 is different in that the thin-film piezoelectric material element 12bF, 12aF are formed in place of the thin-film piezoelectric material element 12b, 12a, as compared with the flexure 106. As illustrated in FIG. 26, the HGA 101F is different in that the flexure 106F is formed in place of the flexure 106, as compared with HGA 101.

Because the thin-film piezoelectric material substrate 1F, thin-film piezoelectric material element 12bF and the HGA 101F respectively have the common constitutions with the thin-film piezoelectric material substrate 1, the thin-film piezoelectric material element 12b and the HGA 101, operation and effect, similar with the thin-film piezoelectric material substrate 1F, thin-film piezoelectric material element 12b and the HGA 101, are able to be obtained.

Further, the thin-film piezoelectric material substrate 1F, thin-film piezoelectric material element 12bF and the HGA 101F respectively include the lower piezoelectric-material protective-film 14 and the upper piezoelectric-material protective-film 24, the lower piezoelectric-material protective-film 14 and the upper piezoelectric-material protective-film 24 are laminated so as to sandwich the piezoelectric material film 13. Therefore, the piezoelectric material film 13 is protected by the lower piezoelectric-material protective-film 14 and the upper piezoelectric-material protective-film 24.

Therefore, the piezoelectric-material film 13 hardly takes the both downward pressure and upward pressure.

Ink Jet Head

Subsequently, an ink jet head 301F, according to the second embodiment, will be explained with reference to FIG. 27.

Figure 27:
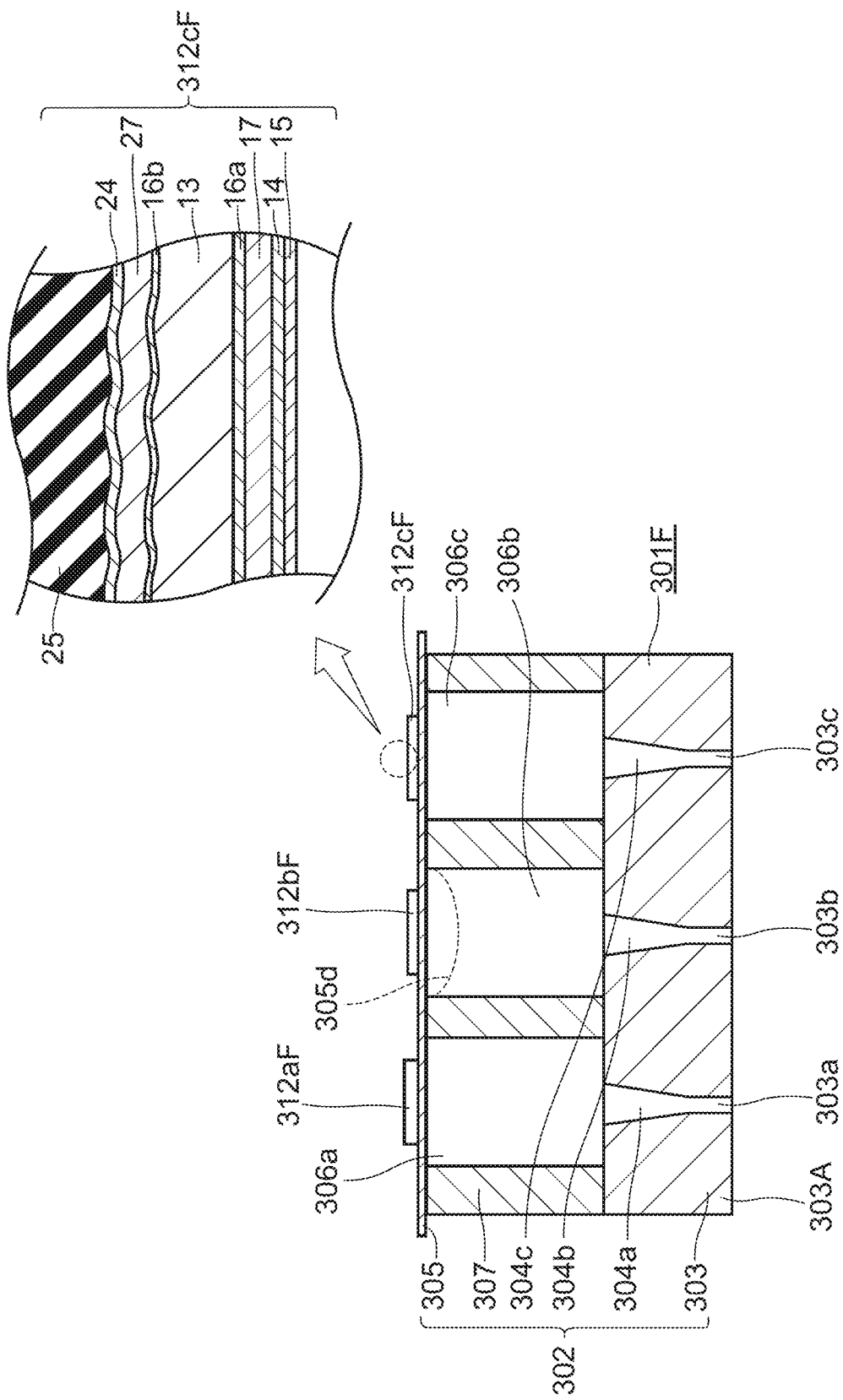
FIG. 27 is a sectional view showing a summary constitution of the ink jet head according to the second embodiment of the present invention.
Figure 28:
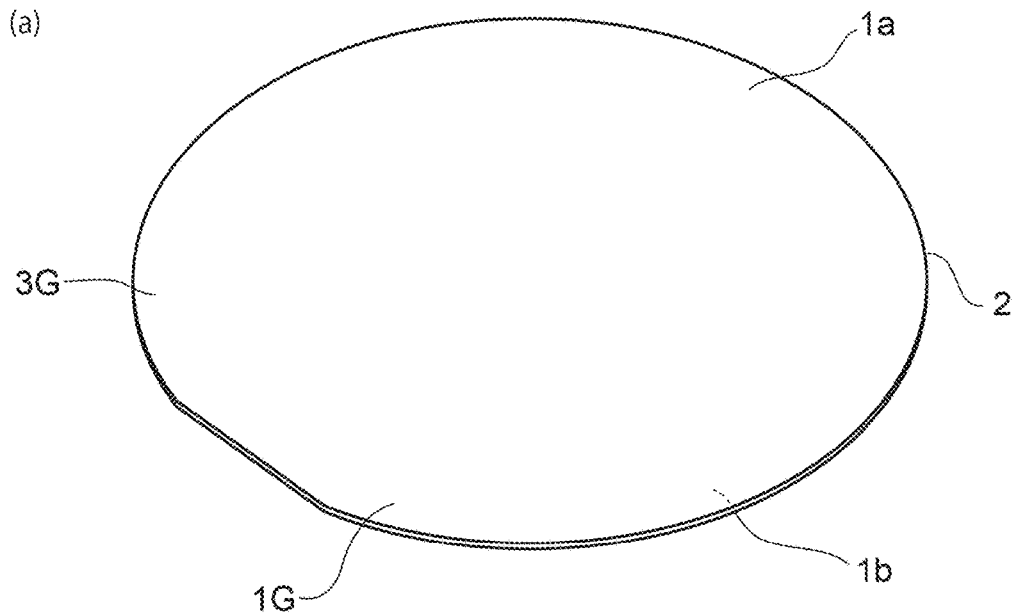
FIG. 28(a) is a perspective view showing whole of the thin-film piezoelectric material substrate, according to the third embodiment of the present invention.
FIG. 28(b) is a plan view, with enlargement, showing the surface of the thin-film piezoelectric material substrate after forming of element sections.
Figure 28:
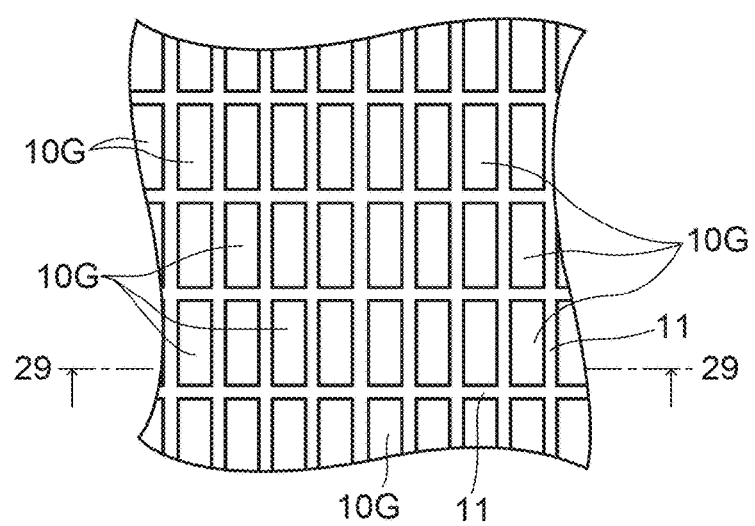

As illustrated in FIG. 27, the ink jet head 301F, according to the second embodiment, is different in that thin-film piezoelectric material elements 312aF, 312bF, 312cF are adhered to the vibration member 305 in place of the thin-film piezoelectric material elements 312a, 312b, 312c.

The thin-film piezoelectric material elements 312aF, 312bF, 312cF respectively have the same structures with the above-described thin-film piezoelectric material elements 12bF. Therefore, the thin-film piezoelectric material elements 312aF, 312bF, 312cF are different in that they respectively have the lower piezoelectric-material protective-film 14 and the upper piezoelectric-material protective-film 24, as compared with the thin-film piezoelectric material elements 312a, 312b, 312c.

Because the ink jet head 301F has the common constitution with the ink jet head 301, operation and effect, similar with the ink jet head 301, is able to be obtained.

Further, because the ink jet head 301F has the lower piezoelectric-material protective-film 14 and the upper piezoelectric-material protective-film 24, the piezoelectric material film 13 is protected by the lower piezoelectric-material protective-film 14 and the upper piezoelectric-material protective-film 24. Therefore, the piezoelectric-material film 13 hardly takes the both downward pressure and upward pressure.

Third Embodiment

Thin-Film Piezoelectric Material Substrate, Thin-Film Piezoelectric Material Element Next, thin-film piezoelectric material substrates 1G, 1H and thin-film piezoelectric material elements 10G, 10H, according to the third embodiment, will be explained with reference to FIG. 28-FIG. 31.

As illustrated in FIG. 28(a), the thin-film piezoelectric material substrate 1G, according to the third embodiment, is different in that a thin-film laminated part 3G is formed on the insulator on Si substrate 2 in place of the thin-film laminated part 3, as compared with the above-described thin-film piezoelectric material substrate 1.

Figure 29:
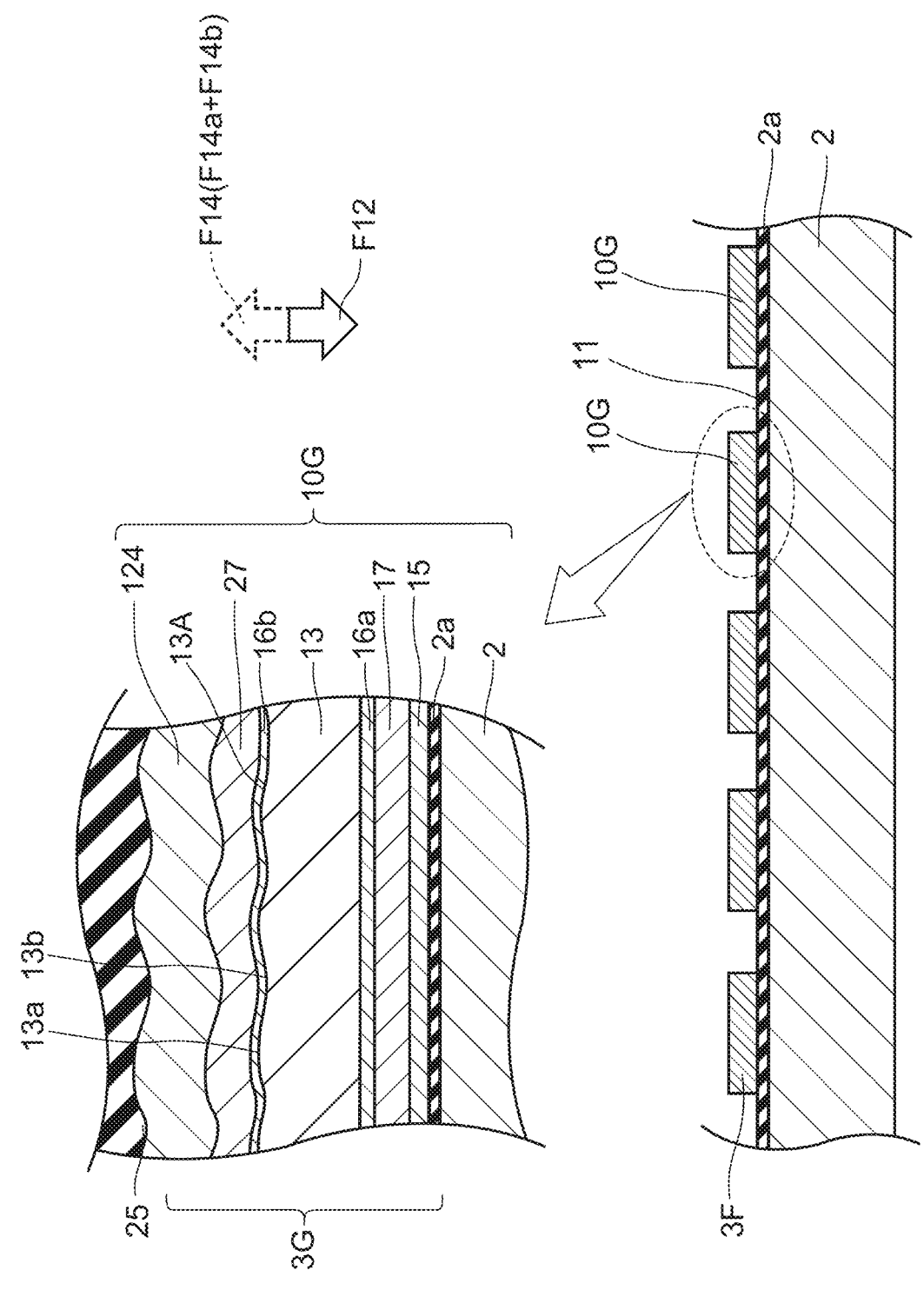
FIG. 29 is a sectional view taken along the line 29-29 in FIG. 28(b)

As illustrated in FIG. 29, the thin-film laminated part 3G is different in that it has a stress balancing film 124, as compared with the thin-film laminated part 3. In the thin-film laminated part 3G, the stress balancing film 124 is formed on the upper electrode film 27 so as to secure a balance between a later-described element stress F12 and an internal stress F14.

The thin-film piezoelectric material substrate 1G also includes a substrate, which a plurality of later-described element sections 10G are not formed (FIG. 28(a)) in the thin-film laminated part 3G, and a substrate, which a plurality of element sections 10G are formed in the thin-film laminated part 3G (FIG. 28(b)). As illustrated in FIG. 28(b), when the plurality of element sections 10G are formed in the thin-film laminated part 3G, the element sections 10G respectively become the thin-film piezoelectric material elements, similar with the above-described thin-film piezoelectric material elements 12bF. Therefore, the thin-film piezoelectric material elements 10G are arranged on the thin-film piezoelectric material substrate 1G. The thin-film piezoelectric material elements 10G include the same constitutions with the thin-film laminated part 3G.

The stress balancing film 124 is formed on the upper electrode film 27. The stress balancing film 124 is a polycrystal thin-film (thickness about 100 nm) using alloy material. The stress balancing film 124 has an internal stress F14 which is able to cancel (be able to offset) the later-described element stress F12.

Then, a film thickness t27 of the upper electrode film 27 has a size, which at least a part from the lower surface (surface of the concavity and convexity surface 13A side) to the upper surface (surface of the stress balancing film 124 side) of the upper electrode film 27 enters the concave part 13b. Because the film thickness t27 has such size, the upper electrode film 27 has also a concavity and convexity structure according to the concavity and convexity surface 13A of the piezoelectric material film 13, and its upper surface becomes concavity and convexity surface according to the concavity and convexity surface 13A. Further, a film thickness t14 (about 100 nm) of the stress balancing film 124 is larger than the film thickness t27 (t27<t14).

The stress balancing film 124 is formed with alloy material which has iron (Fe) as main ingredient, for example. It is preferable that a crystal structure of the stress balancing film 124 is body-centered cubic structure. It is preferable that the stress balancing film 124 is formed with alloy material which includes Fe and at least any one of Co, Mo, Au, Pt, Al, Cu, Ag, Ta, Cr, Ti, Ni, Ir, Nb, Rb, Cs, Ba, V, W, Ru. Further, it is more preferable that the stress balancing film 124 is formed with alloy material which includes Fe and Co, Mo.

Here, the element stress F12 is a stress which the lower electrode film 17, the piezoelectric material film 13 and the upper electrode film 27 curve convexly along the direction from the upper electrode film 27 to the lower electrode film 17 (downward in FIG. 29), in thin-film piezoelectric material elements 10G. The internal stress F14 is a stress which the stress balancing film 124 has. The internal stress F14 operates so as to spread the stress balancing film 124 toward outside, and make it curve convexly along upward.

Because the stress balancing film 124 having the compressive stress is formed on the upper electrode film 27, the stress balancing film 124 pulls up the upper electrode film 27 upward direction, and the internal stress F14 operates so as to cancel the element stress F12, thereby a balance of stress is secured. Note that the internal stress F14 is a stress (resultant stress) which both a stress F14a originated in a material forming the stress balancing film 124 and a stress F14b originated in a later-described growth of crystal grains of the stress balancing film 124 are composed, it is described in detail later.

As mentioned above, because the thin-film piezoelectric material element 10G has the piezoelectric material film 13 and the stress balancing film 124, the thin-film piezoelectric material element 10G has the following operation and effect. Namely, the upper diffusion barrier film 16b is formed on the concavity and convexity surface 13A of the piezoelectric material film 13. But, film thickness of the upper diffusion barrier film 16b is minute thickness, the upper surface is a concavity and convexity surface similar to the concavity and convexity surface 13A. Therefore, the upper electrode film 27 formed on the upper diffusion barrier film 16b has internal stress being compressive stress.

Further, because the upper surface of the upper electrode film 27 is also the concavity and convexity surface similar to the concavity and convexity surface 13A, the stress balancing film 124 has also the stress F14b being compressive stress. The stress balancing film 124 has internal stress including the stress F14b, originated in growth of crystal grains on a film having the concavity and convexity structure, and the stress F14a originated in the material, and it generates strong stress more than the thin-film which has only the stress F14a originated in the material. Because balance between the element stress F12 and the internal stress F14 is secured due to the formation of the stress balancing film 124 on the upper electrode film 27, the thin-film piezoelectric material element 10G has highly improved stress balancing operation more than the conventional one. By this, balance of stress along to the thickness direction inside of the element is surely secured in the thin-film piezoelectric material element 10G.

In a condition which the only element stress F12 operates, the thin-film piezoelectric material element 10G has curved in a direction which the element stress F12 operates. But, the internal stress F14 operates in addition to the element stress F12, balance of the both stresses is surely secured in the thin-film piezoelectric material element 10G. Therefore, the curve of the thin-film piezoelectric material element 10G is suppressed sufficiently. As explained above, though the thin-film piezoelectric material element 10G is a piezoelectric laminated material having a single layer, the curve of thin-film piezoelectric material element 10G is suppressed sufficiently in spite of a condition which voltage is not applied, and crooked displacement is also able to be suppressed.

Therefore, thin-film piezoelectric material element 10G is suitable for the HGA.

Because crystal structure of the stress balancing film 124 is body-centered cubic structure, the stress balancing film 124 generates a large compressive stress in spite of small film thickness. Crystal structure of the upper electrode film 27 is face-centered cubic structure, the upper electrode film 27 generates compressive stress near the boundary to the stress balancing film 124. Further, these crystal structures are different, crack and so on by external force is hardly to occur. Therefore, the thin-film piezoelectric material element 10G has high-degree reliability.

Modified Example

Figure 30:
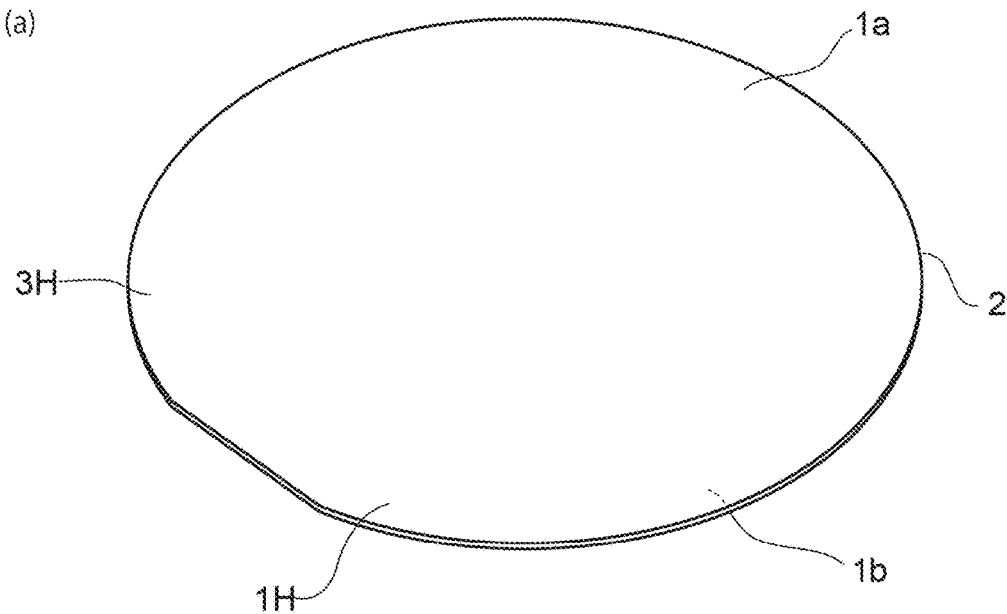
FIG. 30(a) is a perspective view showing whole of the thin-film piezoelectric material substrate, according to the modified example.
FIG. 30(b) is a plan view, with enlargement, showing the surface of the thin-film piezoelectric material substrate after forming of element sections.
Figure 30:
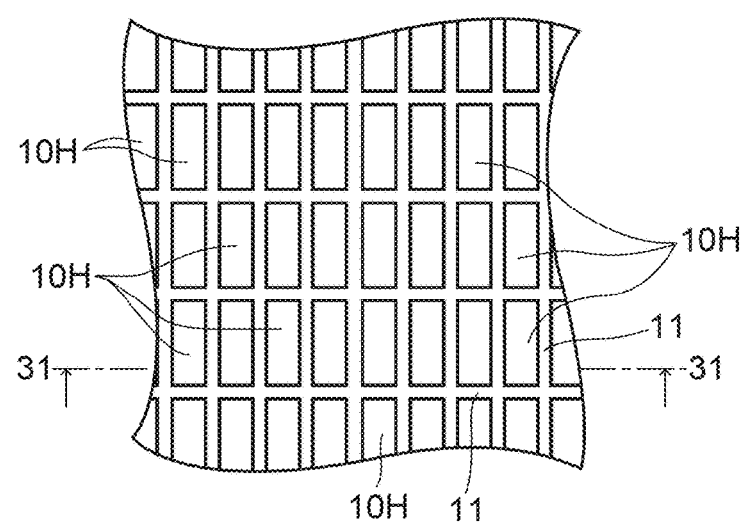

Then, as illustrated in FIG. 30, the thin-film piezoelectric material substrate 1H, according to the modified example, is different in that a thin-film laminated part 3H is formed on the insulator on Si substrate 2 in place of the thin-film laminated part 3G, as compared with the above-described thin-film piezoelectric material substrate 1G.

Figure 31:
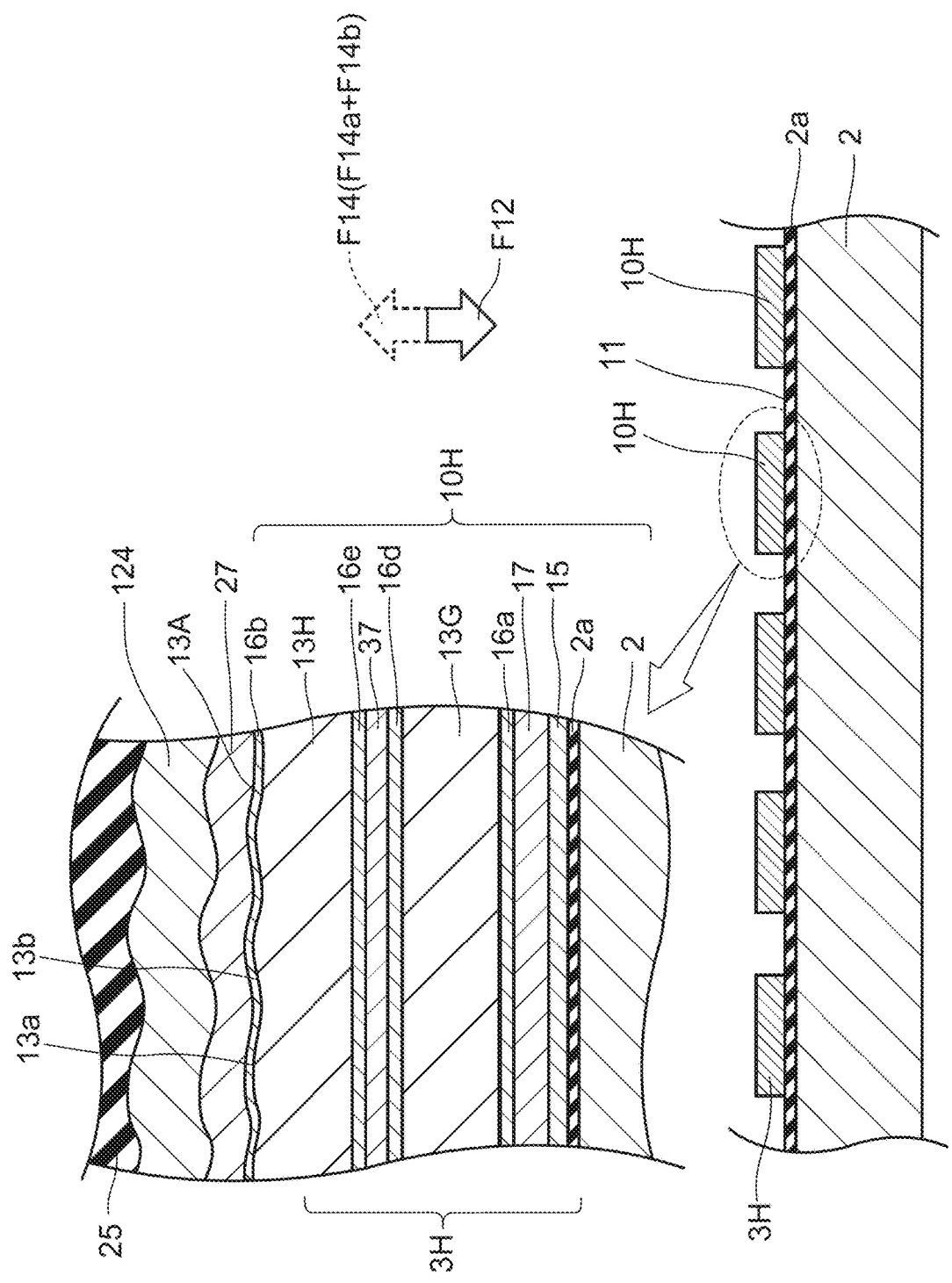
FIG. 31 is a sectional view taken along the line 31-31 in FIG. 30(b)

As illustrated in FIG. 31, the thin-film laminated part 3H is different in that it has piezoelectric material films 13G, 13H, diffusion barrier films 16e, 16d and a middle electrode film 37 in place of the piezoelectric material film 13, as compared with the thin-film laminated part 3G. In the thin-film laminated part 3H, two piezoelectric material films 13G, 13H are laminated sandwiching the diffusion barrier films 16e, 16d and the middle electrode film 37. The piezoelectric material film 13G, the diffusion barrier film 16d, the middle electrode film 37, the diffusion barrier film 16e and the piezoelectric material film 13H are laminated in that order. The piezoelectric material film 13G, the diffusion barrier film 16d, the middle electrode film 37, the diffusion barrier film 16e and the piezoelectric material film 13H are corresponding to a piezoelectric material films layer according to the present invention.

The thin-film piezoelectric material substrate 1H also includes a substrate, which a plurality of later-described element sections 10H are not formed (FIG. 30(a)) in the thin-film laminated part 3H, and a substrate, which a plurality of element sections 10H are formed in the thin-film laminated part 3H (FIG. 30(b)). As illustrated in FIG. 30(b), when the plurality of element sections 10H are formed in the thin-film laminated part 3H, the element sections 10H respectively become the thin-film piezoelectric material elements, similar with the above-described thin-film piezoelectric material elements 12bF. Therefore, the thin-film piezoelectric material elements 10H are arranged on the thin-film piezoelectric material substrate 1H. The thin-film piezoelectric material elements 10H include the same constitutions with the thin-film laminated part 3H.

The piezoelectric material films 13G, 13H (first, second piezoelectric material films) are formed to be a thin-film shape, similar with the above-described piezoelectric material film 13. Further, the piezoelectric material films 13G, 13H are epitaxial films formed by epitaxial growth, similar with the above-described piezoelectric material film 13. The upper surface of the piezoelectric material film 13H is a concavity and convexity surface, similar with the concavity and convexity surface 13A, as not illustrated in FIG. 31. Further, the diffusion barrier films 16d, 16e are thin-films, similar with the upper diffusion barrier film 16b. The diffusion barrier films 16d, 16e are thin-films made of amorphous conductive material, including strontium and ruthenium, such as SRO or the like. The middle electrode film 37 is a thin-film, similar with the upper electrode film 27, the middle electrode film 37 is a polycrystal thin-film with metal element which has Pt as main ingredient. It is possible that the middle electrode film 37 is a thin-film made of amorphous conductive material, including strontium and ruthenium, such as SRO or the like.

The thin-film piezoelectric material element 10H, according to the modified example, exhibits operation and effect, similar with the thin-film piezoelectric material element 10G. Further, because the two piezoelectric material films 13G, 13H are laminated, displacement amount of the thin-film piezoelectric material element 10H is larger than the displacement amount of the thin-film piezoelectric material element 10G.

Then, the above-described thin-film piezoelectric material element 10H includes a laminated structure which the piezoelectric material film 13H (second piezoelectric material film) is laminated on the piezoelectric material film 13G (first piezoelectric material film) though, further, the thin-film piezoelectric material element 10H includes structures indicated in the following 1), 2), 3). Namely, 1) As illustrated in FIG. 32, FIG. 33, the piezoelectric material film 13G (first piezoelectric material film) has size larger than size of the piezoelectric material film 13H (second piezoelectric material film).
2) The piezoelectric material film 13H (second piezoelectric material film) has size larger than the stress balancing film 124.
3) The piezoelectric material film 13G (first piezoelectric material film) and the piezoelectric material film 13H (second piezoelectric material film) respectively includes sizes which a distance Ld is equal to or smaller than three times of a thickness Th, namely, Ld≤Th×3.

Here, the distance Ld is a distance between an outer end part 13Ge (first outer end part) and an outer end part 13He (second outer end part). The thickness Th is a thickness of the piezoelectric material film 13G (first piezoelectric material film).

Further, the outer end part 13Ge (first outer end part) is an end part outside the piezoelectric material film 13G (first piezoelectric material film). The outer end part 13Ge is arranged in the outside most, and it is arranged along a surface direction of the piezoelectric material film 13G (first piezoelectric material film). The outer end part 13He (second outer end part) is an end part outside the piezoelectric material film 13H (second piezoelectric material film). The outer end part 13He is arranged in the outside most, and it is arranged along a surface direction of the piezoelectric material film 13H (second piezoelectric material film).

Figure 32:
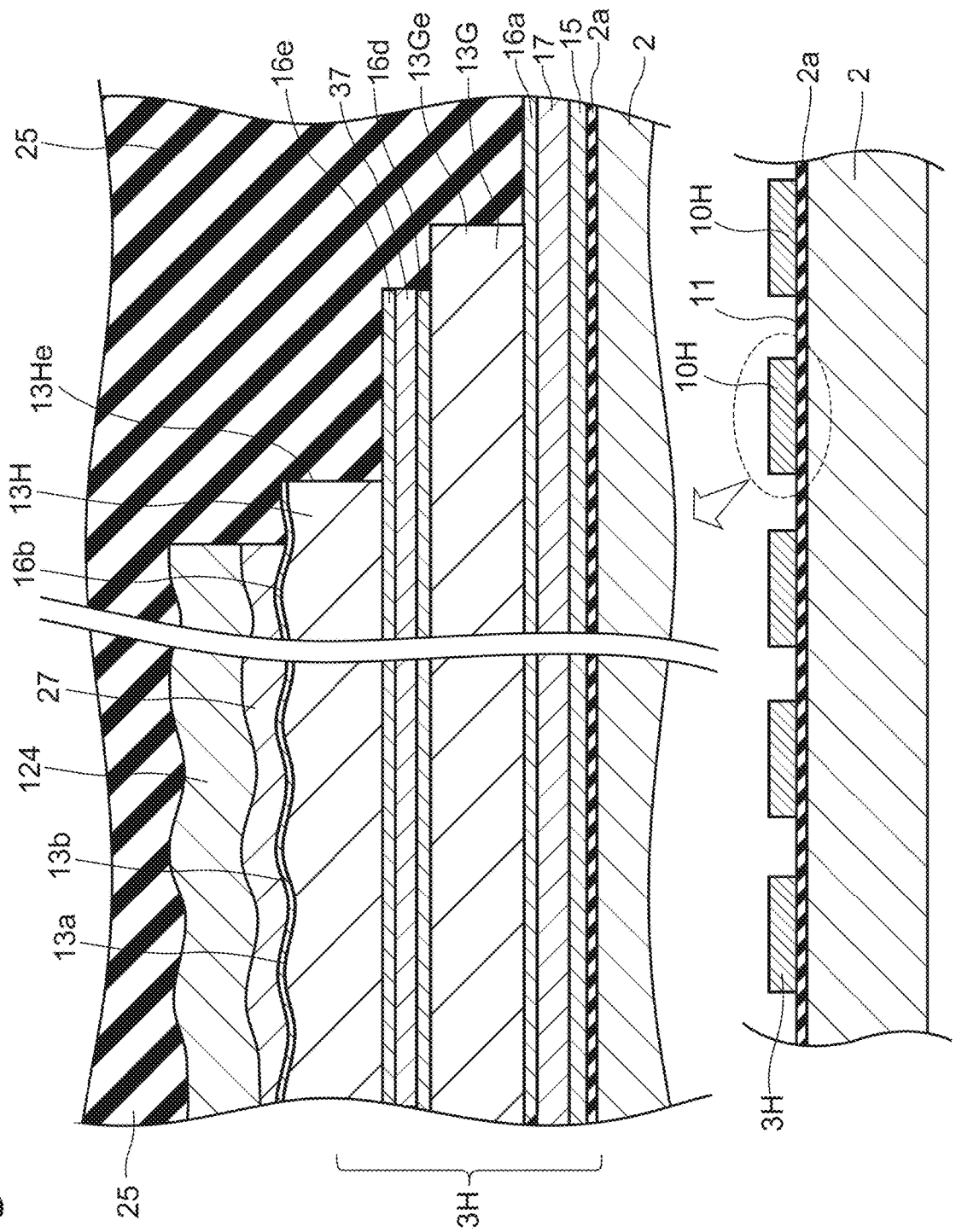
FIG. 32 is a sectional view, corresponding to FIG. 31, showing the thin-film piezoelectric material substrate, according to the modified example.
Figure 33:
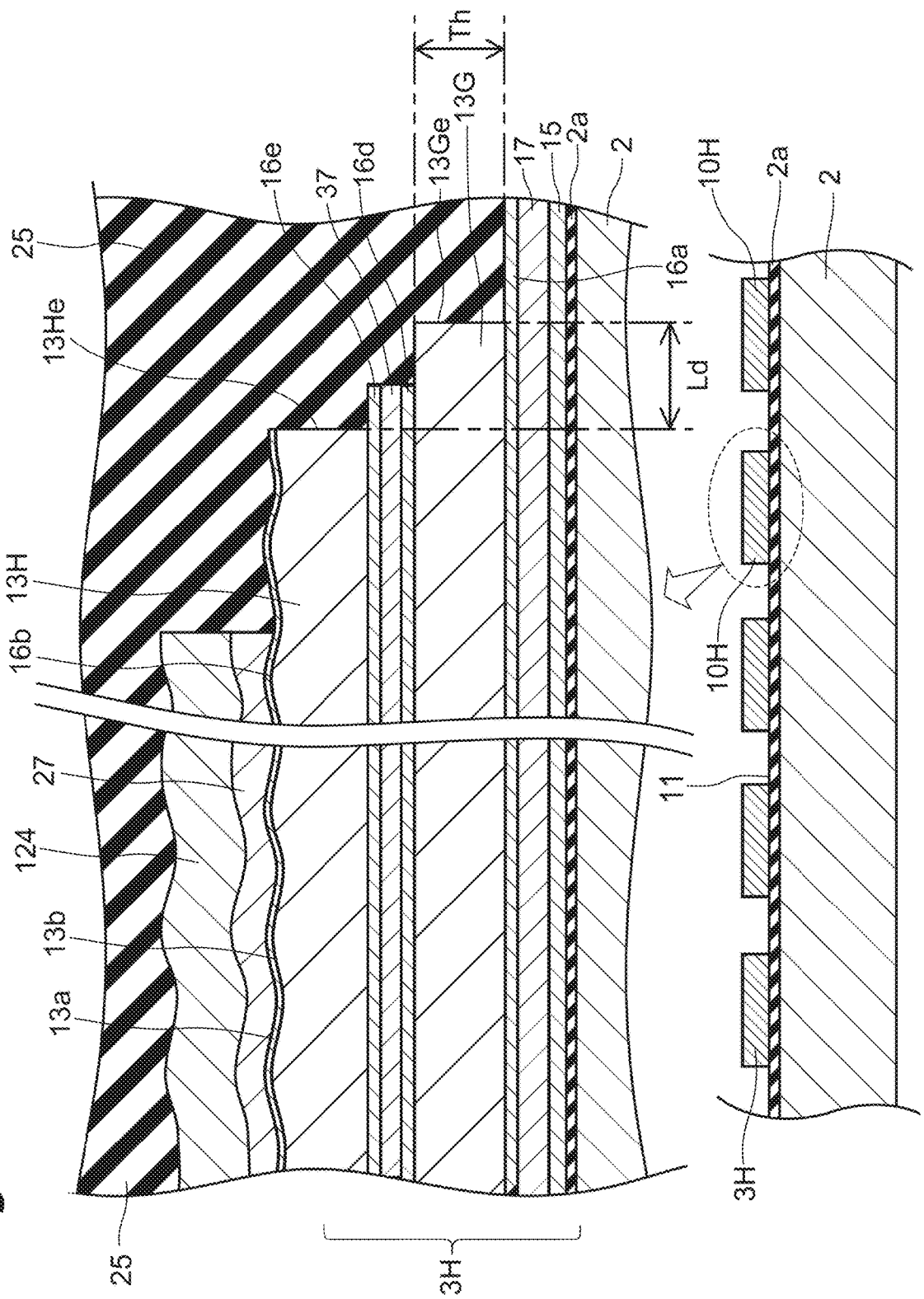
FIG. 33 is a sectional view, corresponding to FIG. 31, showing the thin-film piezoelectric material substrate, according to another modified example.

Then, as illustrated in FIG. 32, the thin-film piezoelectric material element 10H includes the stress balancing film 124. Therefore, the thin-film piezoelectric material element 10H includes the structures indicated in the above-described 1), 2), thereby crack and so on by external force is hardly to occur in the thin-film piezoelectric material element 10H, therefore, the thin-film piezoelectric material element 10H includes high-degree reliability.

However, because the thin-film piezoelectric material element 10H includes the piezoelectric material films 13G, 13H, it has a large piezoelectric property and it has a displacement amount larger than the thin-film piezoelectric material elements 12*b*, 10G, including respectively only one piezoelectric material film 13. Therefore, crack and so on is likely to occur in the thin-film piezoelectric material element 10H, in comparison with the thin-film piezoelectric material elements 12*b*, 10G.

On this point, as illustrated in FIG. 33, it is preferable that thin-film piezoelectric material element 10H includes the structure, indicated in the above 3), namely the structure of Ld≤Th×3. Thereby, it is possible that occurring of the crack and so on is lowered, in the thin-film piezoelectric material element 10H.

In the above-described embodiment, the HGA and ink jet head are exemplarily explained as MEMS, the present invention is able to be applied to another device. For example, the present invention is also applicable to a variable focus lens, various kinds of sensors such as a pressure sensor, a vibration sensor, accelerometer and load sensor or the like. Further the present invention is applicable to a microphone and a speaker.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film piezoelectric material element arranged on a thin-film piezoelectric material substrate,
   wherein the thin-film piezoelectric material substrate comprises:
   an insulator on Si substrate including a substrate including silicon and an insulating layer on a surface of the substrate;
   wherein the thin-film piezoelectric material element comprises a thin-film laminated part on a top surface of the insulating layer,
   wherein the thin-film laminated part comprises:
   a YZ seed layer including yttrium and zirconium, and formed on the top surface of the insulating layer of the insulator on Si substrate;
   a lower electrode film laminated on the YZ seed layer;
   a piezoelectric material film including lead zirconate titanate, shown by a formula Pb $(Zr_xTi_{(1-x)})$ $O_3$ (0≤x≤1), and laminated on the lower electrode film; and
   an upper electrode film laminated on the piezoelectric material film,
   wherein the piezoelectric material film is an epitaxial film,
   wherein the piezoelectric material film has diffraction intensity peaks of a (001) plane and a (002) plane, the lower electrode film includes Pt and has a diffraction intensity peak of a Pt (200) plane and the YZ seed layer has a diffraction intensity peak of a (400) plane,
   wherein the thin-film laminated part further includes an upper piezoelectric-material protective-film, laminated on the upper side of the upper electrode film.

2. The thin-film piezoelectric material element according to claim 1,
   wherein the thin-film laminated part further includes a lower piezoelectric-material protective-film, laminated between the YZ seed layer and the lower electrode film.

3. The thin-film piezoelectric material element according to claim 1,
   wherein the thin-film laminated part further includes a contact via hole which reach the surface of the lower electrode film through the piezoelectric material film.

4. The thin-film piezoelectric material element according to claim 1,
   wherein the YZ seed layer has a two layer structure including a yttrium layer comprising yttrium and a zirconium layer comprising zirconium or one layer structure comprising a zirconium compound including yttrium and zirconium,
   wherein the YZ seed layer has a thickness of 10 nm to 50 nm.

5. A thin-film piezoelectric material element arranged on a thin-film piezoelectric material substrate,
   wherein the thin-film piezoelectric material substrate comprises:
   an insulator on Si substrate including a substrate including silicon and an insulating layer on a surface of the substrate;
   wherein the thin-film piezoelectric material element comprises a thin-film laminated part on a top surface of the insulating layer,
   wherein the thin-film laminated part comprises:
   a YZ seed layer including yttrium and zirconium, and formed on the top surface of the insulating layer of the insulator on Si substrate;
   a lower electrode film laminated on the YZ seed layer;
   a piezoelectric material film including lead zirconate titanate, shown by a formula Pb $(Zr_xTi_{(1-x)})$ $O_3$ (0≤x≤1), and laminated on the lower electrode film; and
   an upper electrode film laminated on the piezoelectric material film,
   wherein the piezoelectric material film is an epitaxial film,
   wherein the piezoelectric material film has diffraction intensity peaks of a (001) plane and a (002) plane, the lower electrode film includes Pt and has a diffraction intensity peak of a Pt (200) plane and the YZ seed layer has a diffraction intensity peak of a (400) plane,
   wherein the thin-film laminated part further includes a stress balancing film, laminated on the upper side of the upper electrode film.

6. A thin-film piezoelectric material element arranged on a thin-film piezoelectric material substrate,
   wherein the thin-film piezoelectric material substrate comprises:

an insulator on Si substrate including a substrate including silicon and an insulating layer on a surface of the substrate;
wherein the thin-film piezoelectric material element comprises a thin-film laminated part on a top surface of the insulating layer,
wherein the thin-film laminated part comprises:
a YZ seed layer including yttrium and zirconium, and formed on the top surface of the insulating layer of the insulator on Si substrate;
a lower electrode film laminated on the YZ seed layer;
a piezoelectric material films layer, laminated on the lower electrode film; and
an upper electrode film laminated on the piezoelectric material films layer,
wherein the piezoelectric material films layer includes a first piezoelectric material film and a second piezoelectric material film;
wherein the first piezoelectric material film and the second piezoelectric material film respectively include lead zirconate titanate, shown by a formula Pb $(Zr_xTi_{(1-x)})O_3 (0 \leq x \leq 1)$, and are epitaxial films,
wherein the first piezoelectric material film and second piezoelectric material film respectively have diffraction intensity peaks of a (001) plane and a (002) plane, the lower electrode film includes Pt and has a diffraction intensity peak of a Pt (200) plane and the YZ seed layer has a diffraction intensity peak of a (400) plane.

7. The thin-film piezoelectric material element according to claim 6,
wherein the thin-film laminated part further includes a stress balancing film laminated on the upper side of the upper electrode film.

8. The thin-film piezoelectric material element according to claim 6,
wherein the piezoelectric material films layer comprises a laminated structure which the second piezoelectric material film is laminated on the first piezoelectric material film,
wherein the first piezoelectric material film has a size larger than a size of the second piezoelectric material film,
wherein the first piezoelectric material film and the second piezoelectric material film respectively include a first outer end part and a second outer end part,
wherein the first outer end part and the second outer end part are respectively arranged in the outside of the first piezoelectric material film and the second piezoelectric material film along a surface direction of the respective first piezoelectric material film and second piezoelectric material film,
wherein the first piezoelectric material film and the second piezoelectric material film respectively include sizes which a distance between the first outer end part and the second outer end part is equal to or smaller than three times of a thickness of the first piezoelectric material film.

9. The thin-film piezoelectric material element according to claim 7,
wherein the piezoelectric material films layer comprises a laminated structure which the second piezoelectric material film is laminated on the first piezoelectric material film,
wherein the first piezoelectric material film has a size larger than a size of the second piezoelectric material film, and the second piezoelectric material film has a size larger than the stress balancing film,
wherein the first piezoelectric material film and the second piezoelectric material film respectively include a first outer end part and a second outer end part,
wherein the first outer end part and the second outer end part are respectively arranged in the outside of the first piezoelectric material film and the second piezoelectric material film along a surface direction of the respective first piezoelectric material film and second piezoelectric material film,
wherein the first piezoelectric material film and the second piezoelectric material film respectively include sizes which a distance between the first outer end part and the second outer end part is equal to or smaller than three times of a thickness of the first piezoelectric material film.

* * * * *